United States Patent
Matsumoto et al.

(10) Patent No.: US 10,096,548 B2
(45) Date of Patent: *Oct. 9, 2018

(54) METHOD OF MANUFACTURING CU WIRING

(71) Applicant: Tokyo Electron Limited, Tokyo (JP)

(72) Inventors: Kenji Matsumoto, Miyagi (JP); Tadahiro Ishizaka, Yamanashi (JP); Peng Chang, Miyagi (JP); Osamu Yokoyama, Yamanashi (JP); Takashi Sakuma, Yamanashi (JP); Hiroyuki Nagai, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,165

(22) Filed: Mar. 16, 2016

(65) Prior Publication Data

US 2016/0276218 A1    Sep. 22, 2016

(30) Foreign Application Priority Data

Mar. 16, 2015  (JP) ................... 2015-051626
Jan. 5, 2016  (JP) ................... 2016-000490

(51) Int. Cl.
  *H01L 21/768*  (2006.01)
  *H01L 23/532*  (2006.01)
  *H01L 21/285*  (2006.01)

(52) U.S. Cl.
  CPC .. *H01L 23/53238* (2013.01); *H01L 21/28556* (2013.01); *H01L 21/76826* (2013.01); *H01L 21/76831* (2013.01); *H01L 21/76843* (2013.01)

(58) Field of Classification Search
  CPC ......... H01L 23/53238; H01L 21/76843; H01L 21/76831; H01L 21/28556; H01L 21/76826
  See application file for complete search history.

(56) References Cited

U.S. PATENT DOCUMENTS

| | | |
|---|---|---|
| 2011/0163451 A1 | 7/2011 | Matsumoto et al. |
| 2014/0103529 A1 | 4/2014 | Matsumoto et al. |
| 2015/0126027 A1 | 5/2015 | Matsumoto et al. |

FOREIGN PATENT DOCUMENTS

| | | |
|---|---|---|
| JP | 2008-300568 | 12/2008 |
| JP | 2010-21447 | 1/2010 |

(Continued)

OTHER PUBLICATIONS

U.S. Appl. No. 15/250,109.*

*Primary Examiner* — Moazzam Hossain
*Assistant Examiner* — Hajar Kolahdouzan

(57) ABSTRACT

In a Cu wiring manufacturing method, a $MnO_x$ film which becomes a self-formed barrier film by reaction with an interlayer insulating film of a substrate is formed on a surface of a recess formed in the interlayer insulating film by ALD. A hydrogen radical process is performed on a surface of the $MnO_x$ film to reduce the surface of the $MnO_x$ film. A Ru film is formed by CVD on the surface of the $MnO_x$ film which has been reduced by the hydrogen radical process. A Cu-based film is formed on the Ru film by PVD to be filled in the recess. When the Ru film is formed, a film-formation condition of the $MnO_x$ film and a condition of the hydrogen radical process are set such that nucleus formation is facilitated and the Ru film is formed in a state where a surface smoothness is high.

22 Claims, 27 Drawing Sheets

(56) References Cited

FOREIGN PATENT DOCUMENTS

JP  WO2014/013941 A1  1/2014
WO  2012/173067  12/2012

\* cited by examiner

130°C, 30cycle

180°C, 44cycle

230°C, 52cycle

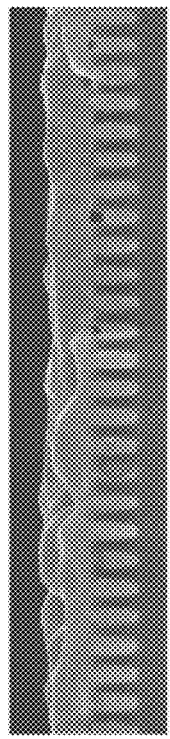 FIG. 16A — 2kW, Ar/H₂ = 110/13 sccm, 300°C, 300sec
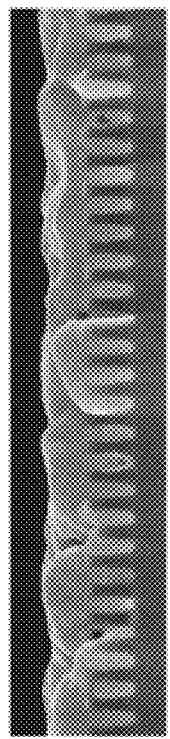 FIG. 16B — 2kW, Ar/H₂ = 40/20 sccm, 300°C, 300sec
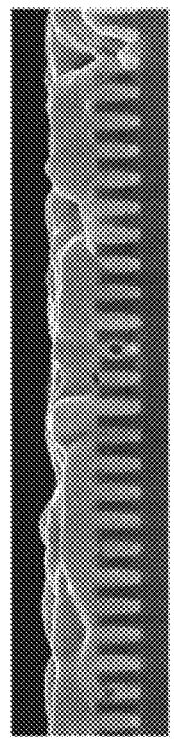 FIG. 16C — 1kW, Ar/H₂ = 110/13 sccm, 300°C, 300sec
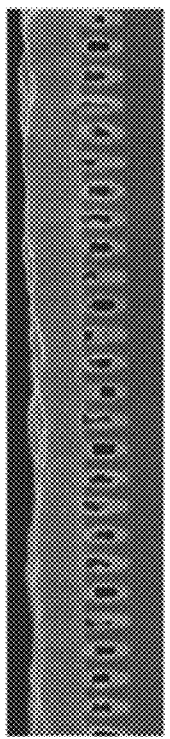 FIG. 16D — 2kW, Ar/H₂ = 110/13 sccm, 300°C, 300sec
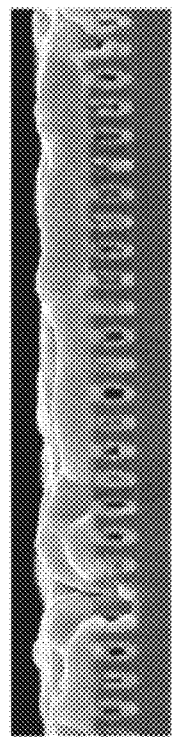 FIG. 16E — 2kW, Ar/H₂ = 110/13 sccm, 100°C, 300sec FIG.20
SAMPLE A 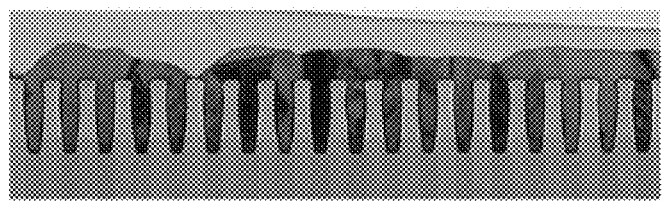
SAMPLE B 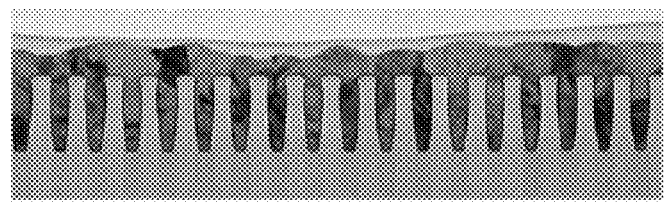
SAMPLE C 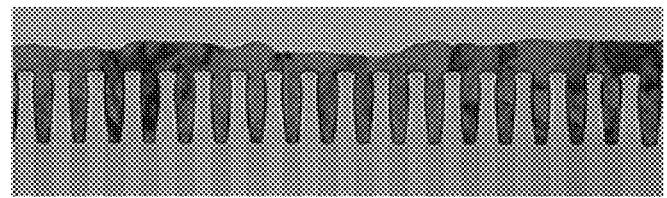

METHOD OF MANUFACTURING CU WIRING

CROSS-REFERENCE TO RELATED APPLICATIONS

This application claims priority to Japanese Patent Application Nos. 2015-051626 and 2016-000490 respectively filed on Mar. 16, 2015 and Jan. 5, 2016, the entire contents of which are incorporated herein by reference.

FIELD OF THE INVENTION

The disclosure relates to a Cu wiring manufacturing method of manufacturing Cu wiring by filling Cu in a recess such as a trench or via hole formed on a substrate.

BACKGROUND OF THE INVENTION

In a manufacturing of a semiconductor device, various processes such as film formation, etching and the like are repeatedly performed on a semiconductor wafer to manufacture a desired semiconductor device. Recently, in order to meet demands for high-speed semiconductor device, miniaturization of a wiring pattern and high level of integration, it is required to realize low resistance of wiring (high conductivity) and high electromigration resistance.

In view of the above, Copper (Cu), which has a higher electromigration resistance and a higher conductivity (lower resistance) than those of aluminum (Al) and tungsten (W), is being used as the wiring material.

The Cu wiring is formed by filling Cu in a trench or via formed in an interlayer insulating film, but in order to prevent Cu from being diffused in the interlayer insulating film, a barrier film is formed before filling Cu.

As a method of forming the barrier film, there is used a method of forming a tantalum (Ta) film, a titanium (Ti) film, a tantalum nitride (TaN) film, a titanium nitride (TiN) film or the like physical vapor deposition (PVD). However, with a further miniaturization of a wiring pattern, it is difficult to obtain a sufficient step coverage by the above-mentioned method. Accordingly, there is examined a method of forming as the barrier film a mangane oxide ($MnO_x$), film by chemical vapor deposition (CVD) or atomic layer deposition (ALD) which can form a thin film with a good step coverage. The $MnO_x$ film, however, has a low adhesion to Cu film, and there has been proposed a Cu wiring forming method in which a Ruthenium (Ru) film having a high adhesion to Cu film is formed on the $MnO_x$ film and a Cu film is formed on the Ru film (see, e.g., Japanese Patent Application Publication Nos. 2008-300568 and 2010-21447).

Meanwhile, when forming the Ru film on the $MnO_x$ film, it is difficult to make the Ru film have a good surface state since a nucleus formation density of Ru is low. Accordingly, there has been proposed a technique in which a hydrogen radical process is performed after the $MnO_x$ film is formed and then the Ru film is formed thereon (see, e.g., PCT Publication No. 2012/173067).

However, with a further miniaturization of a semiconductor device, the aspect ratio of a recess such as a trench or the like is increased. Accordingly, even with the technique disclosed in PCT Publication No. 2012/173067, it is sometimes difficult to form a continuous Ru film with high step coverage on the $MnO_x$ film in the recess or to form a Ru film having a good surface state, which may result in a poor filling of Cu.

SUMMARY OF THE INVENTION

In view of the above, the present disclosure provides a Cu wiring manufacturing method capable of forming a continuous Ru film having a good surface state on a $MnO_x$ film with a good film-forming property and filling Cu in a recess with a good fillability.

In the disclosure of PCT Publication No. 2012/173067, in order to form a good Ru film by solving the problem that the nucleus formation density of Ru is low when the Ru film is formed on the $MnO_x$ film, a hydrogen radical process is performed after the $MnO_x$ film is formed to reduce the surface thereof. However, in case of miniaturization of a semiconductor device, it is difficult to form a Ru film having a good surface state with a good film formation property by merely performing the hydrogen radical process. Therefore, it is required to optimize the conditions of the $MnO_x$ film formation and the hydrogen radical process to obtain a Ru film having a good surface state with a good film formation property.

In accordance with a first aspect, there is provided a Cu wiring manufacturing method for manufacturing a Cu wiring that fills a recess formed in a predetermined pattern on a surface of an interlayer insulating film of a substrate, the method including: forming a $MnO_x$ film which becomes a self-formed barrier film by reaction with the interlayer insulating film at least on a surface of the recess by ALD; performing a hydrogen radical process on a surface of the $MnO_x$ film to reduce the surface of the $MnO_x$ film; forming a Ru film by CVD on the surface of the $MnO_x$ film which has been reduced by the hydrogen radical process; and forming a Cu-based film on the Ru film by PVD to fill the Cu-based film in the recess; wherein when the Ru film is formed, a film-formation condition of the $MnO_x$ film and a condition of the hydrogen radical process are set such that nucleus formation is facilitated and the Ru film is formed in a state where a surface smoothness is high.

In accordance with a second aspect, there is provided a Cu wiring manufacturing method for manufacturing a Cu wiring that fills a recess formed in a predetermined pattern on a surface of an interlayer insulating film of a substrate, the method including: forming a $MnO_x$ film which becomes a self-formed barrier film by reaction with the interlayer insulating film at least on a surface of the recess by ALD; performing a hydrogen radical process on a surface of the $MnO_x$ film to reduce the surface of the $MnO_x$ film; forming a Ru film by CVD on the surface of the $MnO_x$ film which has been reduced by the hydrogen radical process; and forming a Cu-based film on the Ru film by PVD to fill the Cu-based film in the recess; wherein the $MnO_x$ film is formed by alternately supplying a Mn compound-containing gas and an oxygen-containing gas into a processing chamber accommodating the substrate with a purge process for purging an inside of the processing chamber interposed between the supply of the Mn compound-containing gas and the supply of the oxygen-containing gas, wherein a film thickness of the $MnO_x$ film is set to 1 nm to 4.5 nm and a temperature of the substrate is set to be lower than a thermal decomposition temperature of the Mn compound, and wherein the hydrogen radical process is performed for 100 sec or more while setting the temperature of the substrate to 200° C. to 400° C.

BRIEF DESCRIPTION OF THE DRAWINGS

The objects and features of the present invention will become apparent from the following description of embodiments, given in conjunction with the accompanying drawings, in which:

FIGS. 16A to 16E are TEM pictures showing the fillability of Cu when changing the condition of the hydrogen radical process;

FIG. 20 depicts TEM pictures showing sections of samples A, B and C in Experiment 2;

DETAILED DESCRIPTION OF THE EMBODIMENTS

Hereinafter, embodiments of the present invention will be described in detail with respect to the accompanying drawings.

(Embodiment of Cu Wiring Manufacturing Method)

Figure 1:
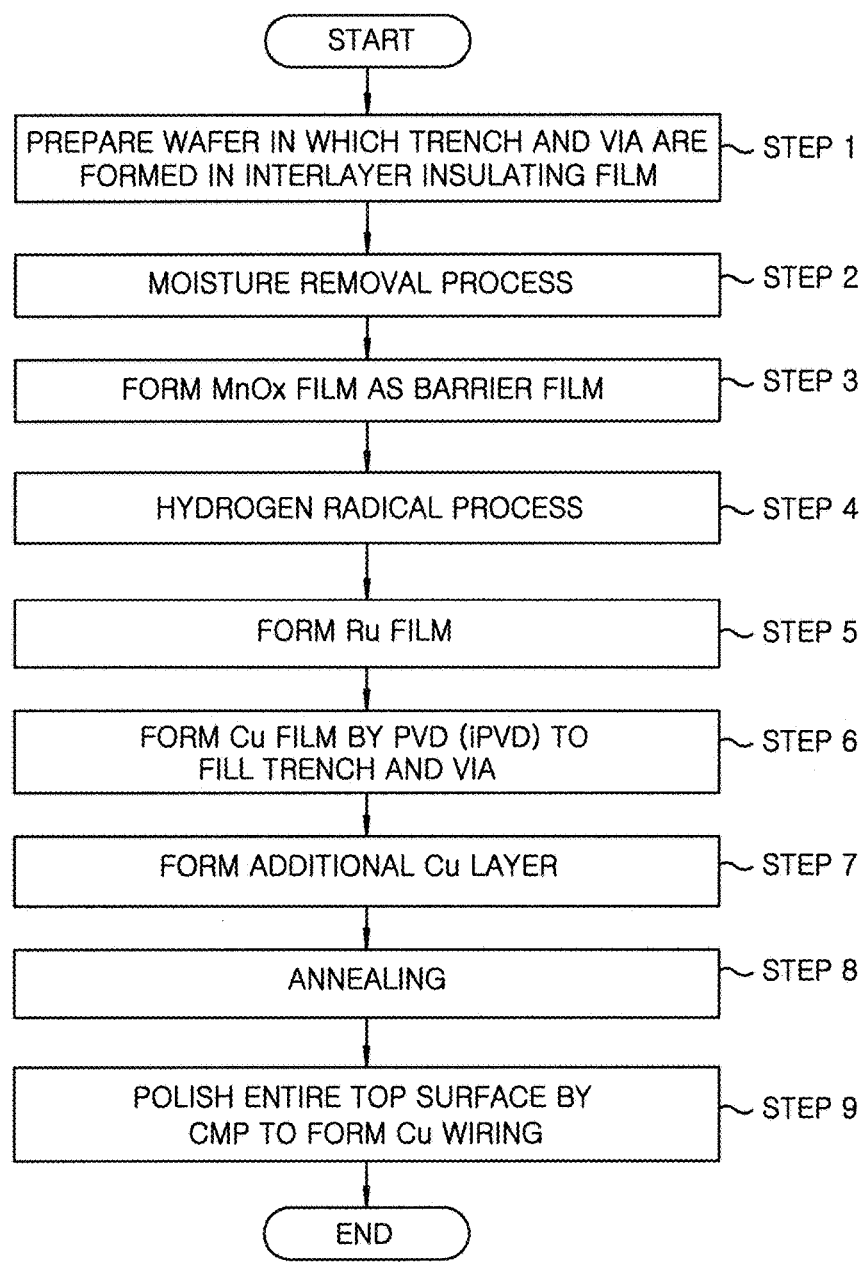
FIG. 1 is a flowchart of a Cu wiring manufacturing method in accordance with an embodiment.

An embodiment of a Cu wiring manufacturing method will be described with reference to a flow chart of FIG. 1 and process cross-sectional views of FIGS. 2A to 2H.

Since manganese oxide can have a plurality of forms such as MnO, $Mn_3O_4$, $Mn_2O_3$, $MnO_2$ and the like, the whole form is collectively indicated as $MnO_x$.

Figure 2A:
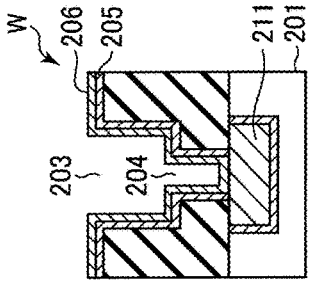
FIGS. 2A to 2H are process diagrams for explaining the Cu wiring manufacturing method.

First, there is prepared a semiconductor wafer (hereinafter, simply referred to as "wafer") W in which an interlayer insulating film 202 made of a $SiO_2$ film, a low dielectric constant (low-k) film (SiCO, SiCOH or the like) or the like is formed on a lower structure 201 (details thereof are omitted) including a lower Cu wiring 211, and a trench 203 and a via hole (hereinafter, simply referred to as "via") 204 are formed in a predetermined pattern in the interlayer insulating film 202 (step 1, FIG. 2A).

Next, with regard to the wafer W, as a pretreatment, moisture of a surface of the insulating film 202 is removed by a degas process or a pre-clean process and copper-oxide formed on a surface of the lower Cu wiring 211 is removed (step 2, not shown in FIGS. 2A to 2H). Thereafter, a $MnO_x$ film 205 serving as a barrier film for suppressing diffusion of Cu is formed on an entire surface including surfaces of the trench 203 and the via 204 (step 3, FIG. 2B)

Subsequently, a hydrogen radical process is performed on the $MnO_x$ film 205 to reduce a surface of the $MnO_x$ film 205 (step 4, see FIG. 2C). This process is for making it easy to form a Ru film by reducing the surface of the $MnO_x$ film 205 to Mn. Further, this process also has a function of allowing a part of the $MnO_x$ film 205 to become a silicate by a reaction with the interlayer insulating film 202.

Figures 2B, 2C, 2D:
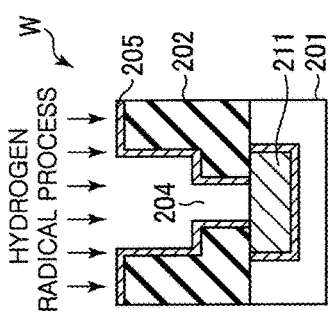

A Ru film 206, serving as a layer to be wetted and having a high wettability to Cu or Cu alloy, is formed on the surface of the $MnO_x$ film 205 subjected to the hydrogen radical process (step 5, FIG. 2D).

Figure 2E:
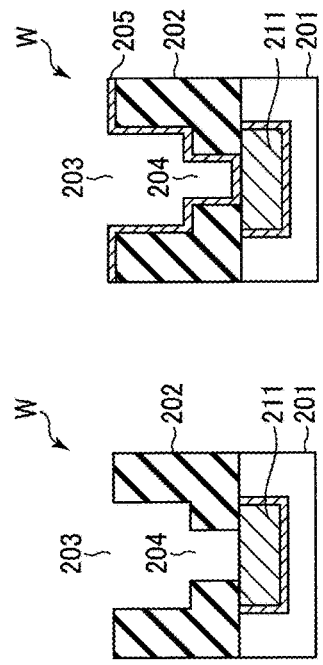

Next, a Cu-based film 207 made of Cu or Cu alloy is formed on a surface of the Ru film 206 by PVD (physical vapor deposition), preferably by iPVD (ionized physical vapor deposition), to fill the trench 203 and the via 204 (step 6, FIG. 2E).

Figure 2H:
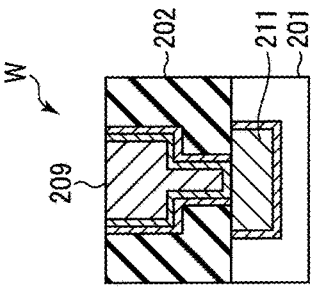
Figures 2F, 2G:
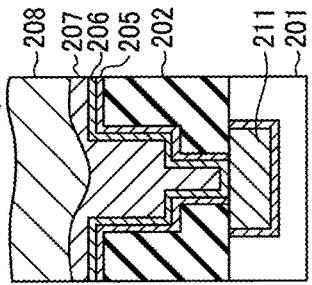

If necessary, in preparation for a subsequent planarization process, a Cu coating is performed on an entire surface of the wafer W to form an additional Cu on the Cu-based film 207 (step 7, FIG. 2F). The additional Cu layer 208 may be formed by the PVD. After forming the additional Cu layer 208, an annealing is performed (step 8, FIG. 2G).

Thereafter, an entire top surface of the wafer W is polished by CMP (chemical mechanical polishing) to remove the additional Cu layer 208, the Cu-based film 207, the Ru film 206 and the $MnO_x$ film 205 serving as a barrier film, so that the entire top surface of the wafer W is planarized (step 9, FIG. 2H). By doing so, a Cu wiring 209 is formed in the trench and the via.

After the Cu wiring 209 is formed, a barrier film made of SiN or SiCN having an etching stop function is formed on the entire surface of the wafer W including the Cu wiring 209 and the interlayer insulating film 202. Further, a metal cap film such as CoW(P) or the like may be selectively formed on the Cu wiring 209 of the top surface of the wafer W.

Next, description will be made in detail on main processes among the above series of processes.

($MnO_x$ Film Formation)

First, a process of forming the $MnO_x$ film 205 serving as a barrier film will be described.

The $MnO_x$ film 205 is formed by ALD (atomic layer deposition). The $MnO_x$ film 205 reacts with Si and O components in the interlayer insulating film 202 at least at a boundary portion with the interlayer insulating film 202 by a heat generated when the $MnO_x$ film 205 is formed or a heat generated during a subsequent process (the hydrogen radical process, the annealing process or the like), to thereby form a manganese silicate ($Mn_xSiO_y$ ($MnSiO_3$ or $Mn_2SiO_4$)) as a self-formed barrier film.

Figure 3A:
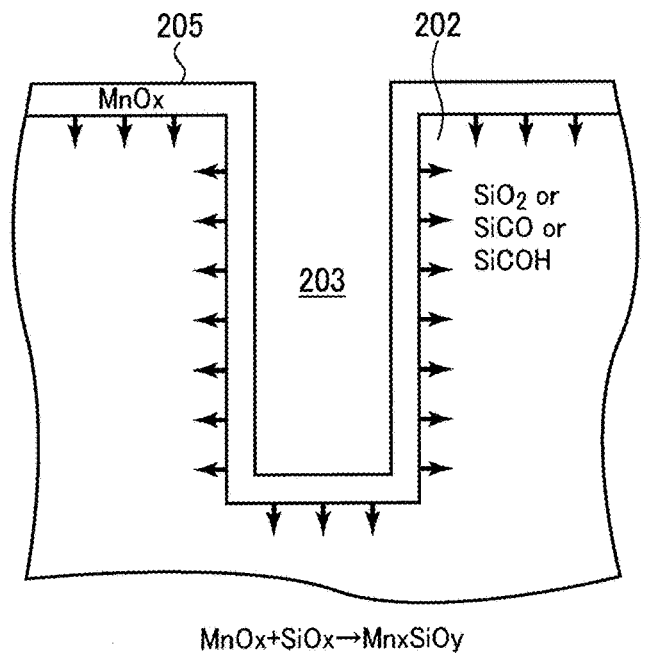
FIGS. 3A and 3B are diagrams for explaining a mechanism in which a $MnO_x$ film is formed in a trench and a self-formed barrier film is formed by a reaction with a base interlayer insulating film.
Figure 3B:
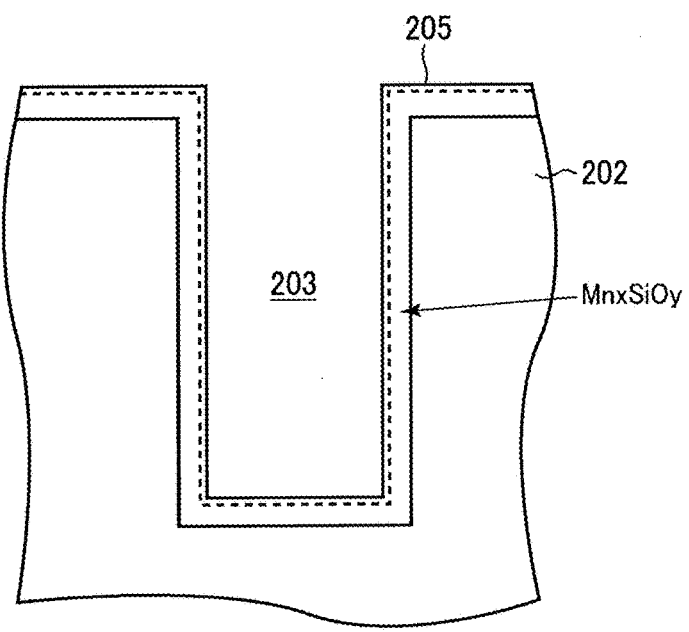

That is, as shown in FIG. 3A, the $MnO_x$ film 205 reacts with Si and O included in the interlayer insulating film 202 that is a base film. Therefore, as shown in FIG. 3B, a barrier film can be formed at the side of the interlayer insulating film 202 that is a base film. For this reason, a volume of the barrier film in a recess such as the trench or the via can be minimized to be close to 0. Accordingly, it is possible to allow a wiring to have a low resistance by increasing a volume of Cu in the wiring. In a viewpoint of increasing the volume of Cu in the wiring, it is preferable that a thickness of the $MnO_x$ film 205 is thinner.

When forming the $MnO_x$ film 205, a Mn compound-containing gas and an oxygen-containing gas are alternately supplied into a processing chamber while performing therebetween a purge of an inside of the processing chamber.

As the Mn compound-containing gas, there are preferably used a cyclopentadienyl-based manganese compound, an amidinate-based manganese compound and an amide amino alkane-based manganese compound.

As the cyclopentadienyl-based manganese compound, there is a bis(alkylcyclopentadienyl) manganese expressed by a general formula $Mn(RC_5H_4)_2$ such as $Cp_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i\text{-}PrCp)_2Mn[=Mn(C_3H_7C_5H_4)_2]$ and $(t\text{-}BuCp)_2Mn[=Mn(C_4H_9C_5H_4)_2]$.

As the amidinate-based manganese compound, there is a bis(N,N'-dialkylacetamidinate) manganese expressed by a general formula $Mn(R^1N=CR^3-NR^2)_2$ which is disclosed in U.S. Patent Application Publication No. 2009/0263965 A1.

As the amide amino alkane-based manganese compound, there is a bis(N,N'-1-alkylamid-2-dialkylaminoalkane) manganese expressed by a general formula $Mn(R^1N-Z-NR^2_2)_2$ which is disclosed in PCT Publication No. 2012/060428. Here, "R, $R^1$, $R^2$, $R^3$" in the above general formula is a functional group indicated by $-C_nH_{2n+1}$ (n is an integer of 0 or more), and "Z" is a functional group indicated by $-C_nH_{2n}-$ (n is an integer of 1 or more).

As other manganese compounds, there may be used a carbonyl-based manganese compound or a beta-diketone-based manganese compound. Dimanganese decacarbonyl $(Mn_2(CO)_{10})$ or methylcyclopentadienyltricarbonylmanganese $(CH_3C_5H_4)Mn(CO)_3)$ may be used as the carbonyl-based manganese compound. Among them, especially, since $Mn_2(CO)_{10}$ has a simple structure, it is expected to form a Mn film having less impurities.

As the oxygen-containing gas, there are used $H_2O$ (water vapor), $N_2O$, $NO_2$, NO, $O_3$, $O_2$, $H_2O_2$, CO, $CO_2$ and alcohols such as methyl alcohol, ethyl alcohol or the like.

As such, the $MnO_x$ film 205 is formed by ALD, but it has been confirmed that the condition of when forming the $MnO_x$ film 205 greatly affects a nucleus formation and surface state of the Ru film 206 that is subsequently formed. Therefore, the film-forming condition of the $MnO_x$ film 205 is set such that the nucleus formation is facilitated when forming the Ru film and the Ru film is formed in a state where a surface smoothness is high. Such condition includes a film thickness and film-forming temperature of the $MnO_x$ film.

The film thickness of the $MnO_x$ film 205, i.e., the number of ALD cycles affects the nucleus formation of Ru, and a nucleus density at which the Ru film starts to be formed is changed by the film thickness of the $MnO_x$ film 205. The film thickness of the $MnO_x$ film 205 is preferably set to 1 to 4.5 nm in a viewpoint of making the nucleus density sufficient to facilitate the formation of the Ru film.

An experiment for confirming the above fact will be described.

For the experiment, a sample was manufactured in which a $SiO_2$ film is formed by CVD using tetraethylortosilicate (TEOS), a $MnO_x$ film is formed on the $SiO_2$ film by ALD at 130° C. by using a amide amino alkane-based manganese compound as an organic Mn compound while changing the number of cycles, a hydrogen radical process is performed with a hydrogen concentration of 10% for 30 seconds at 300° C., and a Ru film is formed by CVD for 300 seconds at 180° C. by using ruthenium carbonyl. In this regard, a relationship between the number of ALD cycles and a film thickness of the Ru film is shown in FIG. 4, and a relationship between the number of ALD cycles and Haze value (an index of surface roughness of a film, arbitrary unit) of the Ru film is shown in FIG. 5.

Figure 4:
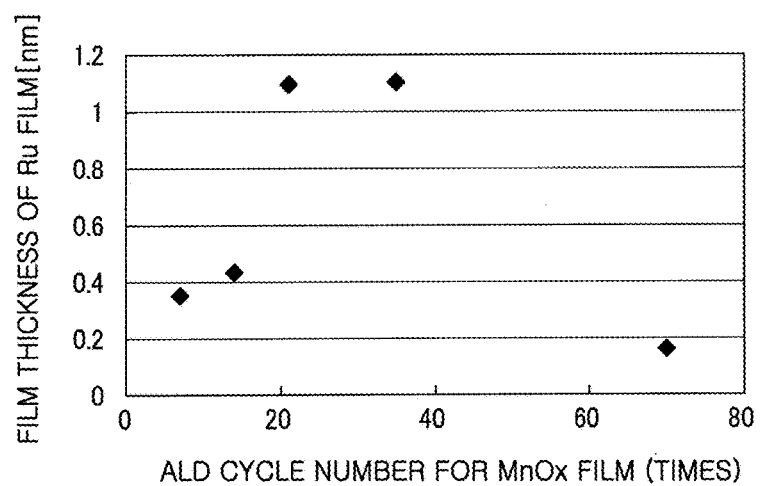
FIG. 4 is a graph showing a relationship between the number of ALD cycles and a film thickness of a Ru film when the $MnO_x$ film is formed.
Figure 5:
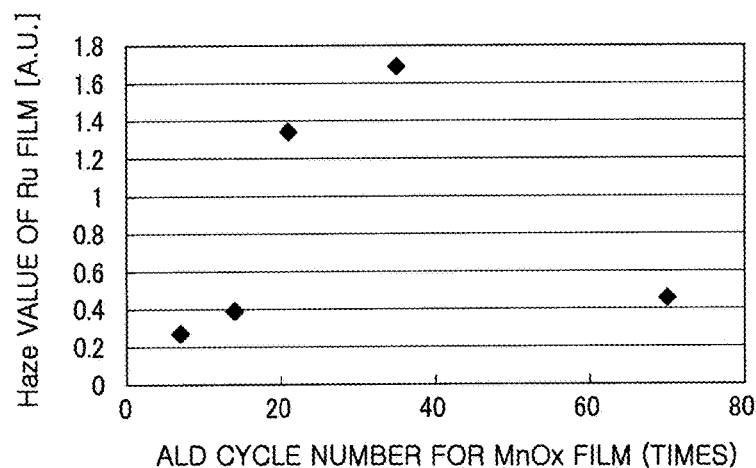
FIG. 5 is a graph showing a relationship between the number of ALD cycles and Haze value of a Ru film when the $MnO_x$ film is formed.

As shown in FIG. 4, a relatively thick Ru film is formed at 17 to 60 ALD cycles but the thickness of the Ru film is thin at the other cycles. Further, as shown in FIG. 5, the Haze value that is an index of film surface roughness displays the same tendency as in the thickness of the Ru film. This means that a sufficient film forming cannot be performed if a film thickness of the $MnO_x$ film is too thin or too thick, since in that case, a nucleus density at which the Ru film starts to be formed by CVD is lowered at the surface of the $MnO_x$ film after the hydrogen radical process. Further, it is confirmed that a film forming can be sufficiently performed at 17 to 60 ALD cycles. It is the most preferable that the number of ALD cycles is around 30 cycles in view of obtaining a good Ru film. The film thickness of the $MnO_x$ film corresponding to 17 to 60 ALD cycles is 1.2 to 4.3 nm. A relationship between the number of cycles and the film thickness is slightly changed depending on a film forming temperature. However, if the film thickness of the $MnO_x$ film is almost 1 to 4.5 nm, the Ru film having a desired film thickness can be formed on the $MnO_x$ film.

On the other hand, the Cu wiring is required to have good electrical characteristics such as leakage characteristics, and a small distortion of the wiring pattern. It has been found that, in order to provide a Cu wiring having good electrical characteristics and a small distortion of the wiring pattern, it is effective to make the film thickness of the $MnO_x$ film thin within the above-described thickness range and increase the amount of the manganese silicate. In order to sufficiently generate the manganese silicate as described above, it is preferable to perform an annealing process after the formation of the $MnO_x$ film, and the hydrogen radical process after the formation of the $MnO_x$ film functions as the annealing process for generating the manganese silicate. To obtain good electrical characteristics, a ratio of the silicate (Mn silicate/($MnO_x$+Mn silicate)) is preferably 30% or more and the number of ALD cycles is preferably 31 or less to obtain the above ratio. In order to increase the amount of the manganese silicate while keeping the smoothness of the Ru film good to obtain good electrical characteristics, the number of ALD cycles is preferably in a range of 19 to 31, and more preferably in a lower range of, e.g., 19 to 25, particularly 21. 19 to 31 ALD cycles correspond to 1.3 to 2.2 nm of film thickness, so that 19 to 31 ALD cycles correspond to 3 to 5 layers of MnO having a lattice constant of 0.44 nm. Accordingly, considering fluctuation range, the film thickness of $MnO_x$ film is preferably in a range of 1 to 2.5 nm to obtain good electrical characteristics by increasing the amount of manganese silicate while keeping the smoothness of Ru film good.

Silicate is stronger to acid than $MnO_x$, and has a high resistance to CMP chemicals and cleaning chemicals. The increased ratio of silicate is advantageous also in terms of CMP. The silicate having a high resistance to CMP chemicals and cleaning chemicals leads to improvement of electrical characteristics due to the increased ration of silicate and suppression of distortion of the wiring pattern.

Figure 6:
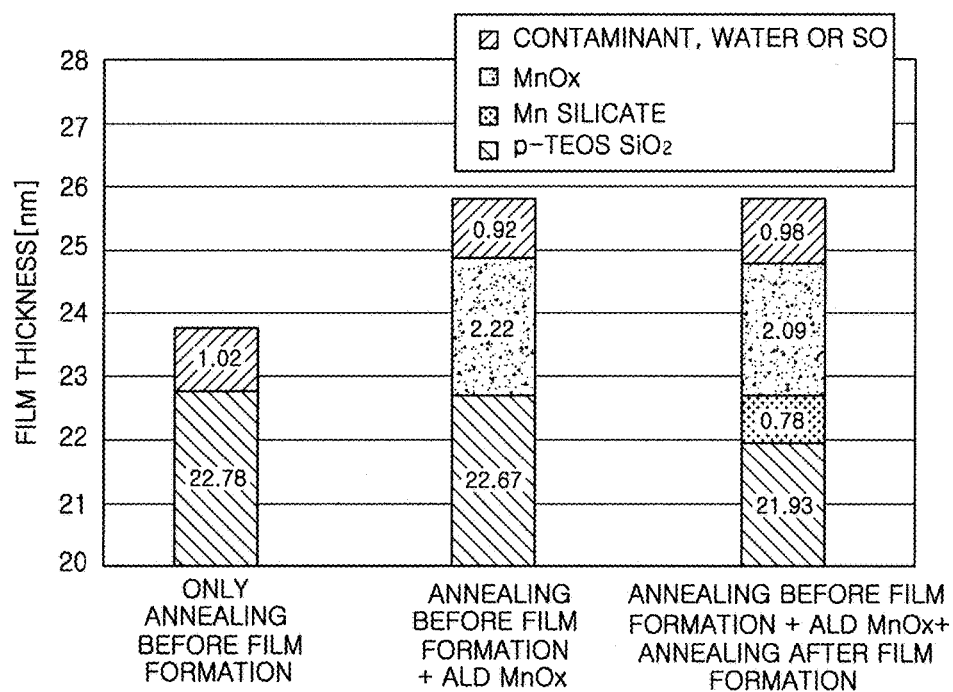
FIG. 6 is a graph showing results of examining a laminated film structure of in each process step by using a X-ray reflectometry (XRR)

FIG. 6 shows results of examining a laminated film structure in each process step by using a X-ray reflectometry (XRR). Here, there are shown the laminated film structure in each of a step of just annealing at 300° C. a $SiO_2$ film formed by CVD using tetraethylortosilicate (TEOS), a step of forming a $MnO_x$ film on the $SiO_2$ film by ALD (30 cycles) at 130° C. by using an amide amino alkane-based manganese compound as the organic Mn compound, and a step of annealing at 400° C. after the formation of the $MnO_x$ film. The annealing before the film formation corresponds to a moisture removal process, and the annealing after the film formation corresponds to hydrogen radical process. From FIG. 6, it has been found that silicate is hardly generated just in a state where the $MnO_x$ film is formed and is generated by the annealing after the formation of the $MnO_x$ film. However, although not shown, even just after the formation of the $MnO_x$ film, there is generated a small amount of silicate which cannot be confirmed by XRR but can be confirmed by XPS (X-ray photoelectron spectroscopy).

Figure 7:
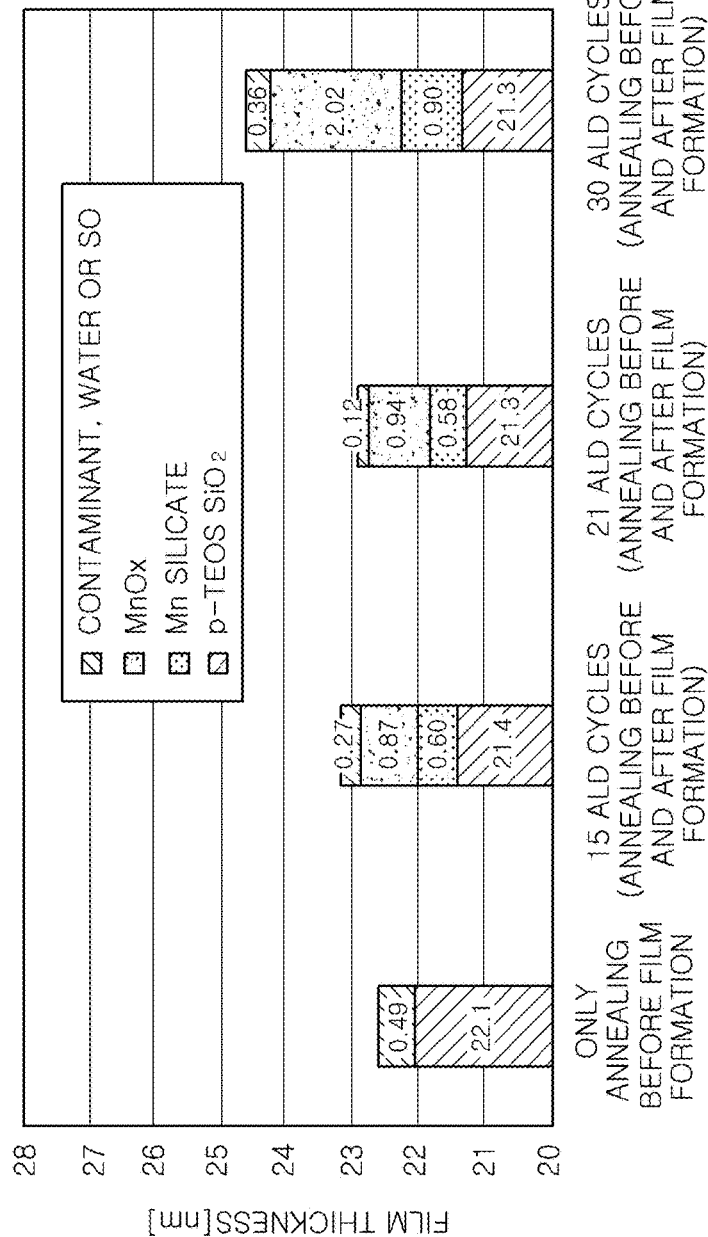
FIG. 7 is a graph showing results of analyzing a laminated film structure when $MnO_x$ film is formed while changing the number of ALD cycles to 15, 21 and 30, and annealing is performed at 300° C. and 400° C. before and after each $MnO_x$ film is formed.

Next, the laminated film structure was analyzed by the XRR after a $MnO_x$ film is formed by changing the number of ALD cycles to 15, 21 and 30 while fixing the annealing before and after the formation of the $MnO_x$ film at 300° C. and 400° C. The results are shown in FIG. 7. From FIG. 7, it has been found that as the number of ALD cycles is decreased, the film thickness is thinner and the ratio of silicate is greater. Specifically, at 15 ALD cycles, since the total film thickness of $MnO_x$ and Mn silicate is 1.47 nm and the film thickness of the Mn silicate is 0.60 nm, the ratio of silicate is 40.8%. At 21 ALD cycles, since the total film thickness of $MnO_x$ and Mn silicate is 1.52 nm and the film thickness of the Mn silicate is 0.58 nm, the ratio of silicate is 38.2%. At 30 ALD cycles, since the total film thickness of $MnO_x$ and Mn silicate is 2.92 nm and the film thickness of the Mn silicate is 0.90 nm, the ratio of silicate is 30.8%.

Figure 8:
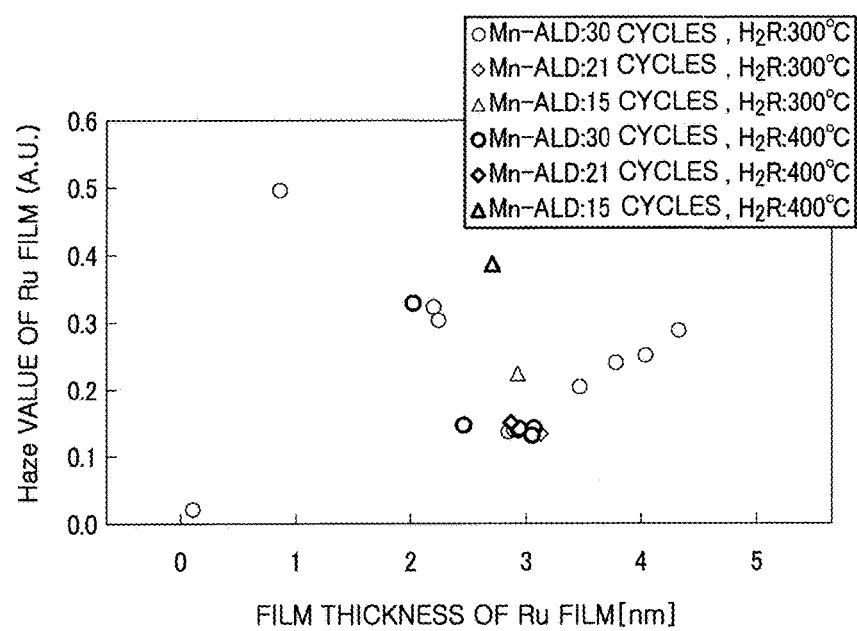
FIG. 8 is a graph showing a relationship between a film thickness of a Ru film and Haze value of the surface of the Ru film when $MnO_x$ film is formed while changing the number of ALD cycles to 15, 21 and 30, and the Ru film is formed on each $MnO_x$ film after a hydrogen radical process is performed.

Next, there was obtained a relationship between a film thickness of a Ru film and Haze value of the surface of the Ru film by forming a $MnO_x$ film on a $SiO_2$ film of a substrate subjected to an annealing process at 300° C. while changing the number of ALD cycles to 15, 21 and 30, performing the hydrogen radical process ($H_2R$) for 300 seconds at 300° C. or 400° C., and then forming the Ru film on the $MnO_x$ film by CVD at 195° C. using ruthenium carbonyl. The results are shown in FIG. 8. From FIG. 8, it has been found that at 15 ALD cycles of the $MnO_x$ film, the surface roughness of the Ru film deposited on the $MnO_x$ film is increased. 15 ALD cycles of the $MnO_x$ film corresponds to 1.1 nm of film thickness and corresponds to 2.4 layers of MnO having a lattice constant of 0.44 nm, not reaching 3 layers. Meanwhile, 21 ALD cycles of the $MnO_x$ film corresponds to 1.5 nm of film thickness and corresponds to 3.4 layers of MnO having a lattice constant of 0.44 nm. Further, 30 ALD cycles of the $MnO_x$ film corresponds to 2.1 nm of film thickness and corresponds to 4.8 layers of MnO having a lattice constant of 0.44 nm. From this, in order to ensure the smooth surface roughness of the Ru film deposited on the $MnO_x$ film, it can be said that the $MnO_x$ film is required to be a laminated film having 3 or more layers of MnO having a lattice constant of 0.44 nm. Moreover, the mechanism of the film thickness and the Haze value of the Ru film showing such behavior will be later described in detail with reference to FIG. 17.

From the above results, there has been found that 21 and 30 ALD cycles are preferable to obtain a good surface smoothness of the Ru film; and 3 to 5 layers of MnO, 1.3 to 2.2 nm of film thickness, or 19 to 31 ALD cycles are preferable to increase the electrical characteristics while keeping the surface smoothness good, the ALD cycles of a lower range of, e.g., 19 to 25 ALD cycles (corresponding to a laminated film of 3 to 4 MnO layers) being more preferable and 21 ALD cycle (corresponding to a laminated film of about 3 MnO layers) being most preferable.

When forming the $MnO_x$ film 205 by ALD, if a film-forming temperature reaches a value higher than a pyrolysis-starting temperature of a manganese compound that is a film-forming material, a film-forming mode is switched from an ALD mode to a CVD mode. Accordingly, a surface of the $MnO_x$ film is roughened and carbon is mixed into the MnO$_x$ film. Then, the Ru film is discontinuously formed on the MnO$_x$ film and a surface of the Ru film is roughened, which makes the smoothness disappear. Consequently, fillability of Cu deteriorates. In this respect, in order to improve the surface smoothness of the Ru film, it is preferable that an ALD film-forming temperature of the MnO$_x$ film 205 is set to a value lower than the pyrolysis temperature of the manganese compound used. Further, since the formation of the MnO$_x$ film which uses an organic Mn compound cannot be performed by ALD at a temperature lower than a vaporization-starting temperature of the organic Mn compound (the organic Mn compound cannot be supplied as a gas into the processing chamber), the vaporization-starting temperature becomes a practical lower limit of the ALD film-forming temperature.

For example, in a case of using the amide amino alkane-based manganese compound (bis(N,N'-1-alkylamid-2-dialkylaminoalkane) manganese), the pyrolysis starts at about 230° C. Therefore, it is preferable that the ALD film-forming temperature is below 230° C. In order to effectively vaporize the manganese compound, it is required to heat the manganese compound to 80° C. or more. Accordingly, the ALD film-forming temperature is preferably set to 100 to 180° C. In order to prevent the film-forming mode from being switched to a CVD mode and increase a film-forming speed, the ALD film-forming temperature is more preferably set to about 130° C. Further, also in a case of using another desirable manganese compound, i.e., cyclopentadienyl-based manganese compound or an amidinate-based manganese compound, the film forming can be performed with the same film thickness in the same temperature range.

Figure 9A:
FIGS. 9A to 9C are TEM pictures showing the fillability of Cu when changing a film-forming temperature for the $MnO_x$ film.
Figure 9B:
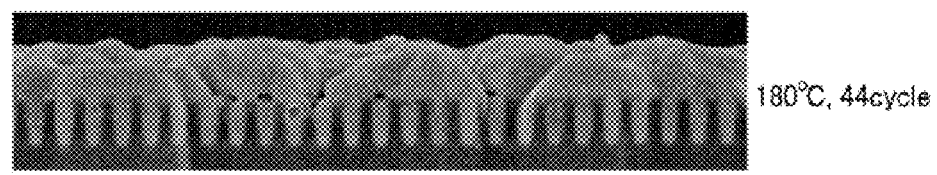
Figure 9C:
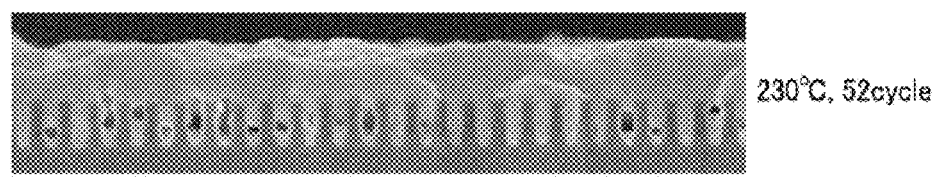

FIGS. 9A to 9C are pictures taken by a transmission electron microscope (TEM), which show fillability of Cu when changing the ALD film-forming temperature of the MnO$_x$ film. In FIG. 9A, the film-forming temperature of the MnO$_x$ film was 130° C. and the number of ALD cycles was 30. In FIG. 9B, the film-forming temperature was 180° C. and the number of ALD cycles was 44. In FIG. 9C, the film-forming temperature was 230° C. and the number of ALD cycles was 52. The number of cycles has been adjusted to make the film thickness of the MnO$_x$ film equal at the respective temperatures. Other conditions were the same as in the sample used in the experiment of FIGS. 4 and 5.

As shown in FIGS. 9A to 9C, a satisfactory fillability of Cu is shown at the film-forming temperatures of 130° C. and 180° C. However, it is seen that when the film-forming temperature reaches 230° C., the fillability of Cu deteriorates. This is considered because the amide amino alkane-based manganese compound used herein starts to be pyrolyzed around 230° C., the film-forming mode is switched to a CVD mode so that a surface of the MnO$_x$ film is roughened, and carbon is mixed into the MnO$_x$ film to thereby make the Ru film formed on the MnO$_x$ film discontinuous, and a surface of the Ru film is roughened, which makes the smoothness disappear.

It is preferable that a pressure in the processing chamber when forming the MnO$_x$ film 205 by ALD is within a range of 0.133 to 13.3 Pa. In this experiment, the pressure in the processing chamber was set to about 1 Pa.

(Hydrogen Radical Process)

Next, the hydrogen radical process will be described.

The hydrogen radical process is a process of modifying a surface of the MnO$_x$ film 205 to Mn by reducing the MnO$_x$ film 205, which makes it easy to form the Ru film. That is, by the hydrogen radical process, an incubation time of when forming the Ru film can be made short, thereby increasing a film-forming rate at the beginning of the film-forming.

Further, a film quality of the Ru film becomes better (low resistance), a surface roughness of the Ru film is reduced, and the Ru film is formed thin and uniformly with a high step coverage.

It is preferable that the hydrogen radical process is performed without exposing the MnO$_x$ film 205 to the atmosphere after forming the MnO$_x$ film 205. In a case of exposing the MnO$_x$ film to the atmosphere after forming the MnO$_x$ film, a degas process is preferably performed, before the hydrogen radical process, in the processing chamber in which the hydrogen radical process is to be performed.

A method of performing the hydrogen radical process is not important as long as hydrogen radicals (atomic hydrogen) are generated. For example, there are a remote plasma process, a plasma process, and a process of making a hydrogen gas contact with heating filaments.

The remote plasma process is performed by using hydrogen radicals in hydrogen plasma that has been generated by inductively coupled plasma, microwave plasma or the like outside the processing chamber, and supplied into the processing chamber.

The plasma process is performed by using hydrogen radicals in hydrogen plasma that has been generated in the processing chamber by capacitively coupled plasma, inductively coupled plasma or the like generated in the processing chamber.

In the process of making a hydrogen gas contact with heating filaments, the heating filaments serve as a catalyst and hydrogen radicals are generated by catalytic cracking reaction.

In such a hydrogen radical process, as in the formation of the MnO$_x$ film 205, it has been found that a process condition highly affects a nucleus formation and surface state of the Ru film 206 that is subsequently formed. Therefore, the condition of the hydrogen radical process is set such that the nucleus formation is facilitated when forming the Ru film and the Ru film is formed in a state where a surface smoothness is high. Such condition includes processing time and a processing temperature.

The processing temperature (wafer temperature) of the hydrogen radical process is an important factor of determining reducibility of the MnO$_x$ film 205. It is considered that as the processing temperature becomes higher, the reduction of a surface of the MnO$_x$ film 205 proceeds and a Ru film having a good surface smoothness can be obtained. However, if the processing temperature exceeds 400° C., there arises concern that an adverse effect such as deterioration of the interlayer insulating film or diffusion of Cu may be caused on the Cu wiring that has been already formed on the wafer W. Accordingly, the processing temperature of the hydrogen radical process is preferably set to a high level in a range, which does not cause the above adverse effect, for example, of 200° C. to 400° C., and particularly 300° C. to 400° C. It is preferable that the processing temperature is 400° C. Moreover, the processing time of the hydrogen radical process is also an important factor of determining reducibility of the MnO$_x$ film 205. The processing time for obtaining a sufficient reducibility is preferably set to 100 seconds or more, and more preferably set to about 300 seconds. If the processing temperature is below 200° C. and the processing time is smaller than 100 seconds, there arises concern that reduction of the surface of the MnO$_x$ film 205 is not sufficient and the nucleus formation of Ru is not sufficient, so that a desired Ru film may not be formed.

Further, it is possible to increase the ratio of silicate by the hydrogen radical process. That is, as described above, in order to increase the ratio of silicate, it is preferable to perform an annealing process after the formation of the $MnO_x$ film, and the hydrogen radical process has the annealing function. Even in view of increasing the ratio of silicate, it is preferable to increase the temperature of the hydrogen radical process. Further, in a case where an annealing process for degas immediately before the hydrogen radical process, the ratio of silicate may be increased by the annealing process for degas.

An experiment for finding a proper temperature of the hydrogen radical process will now be described.

Figure 10:
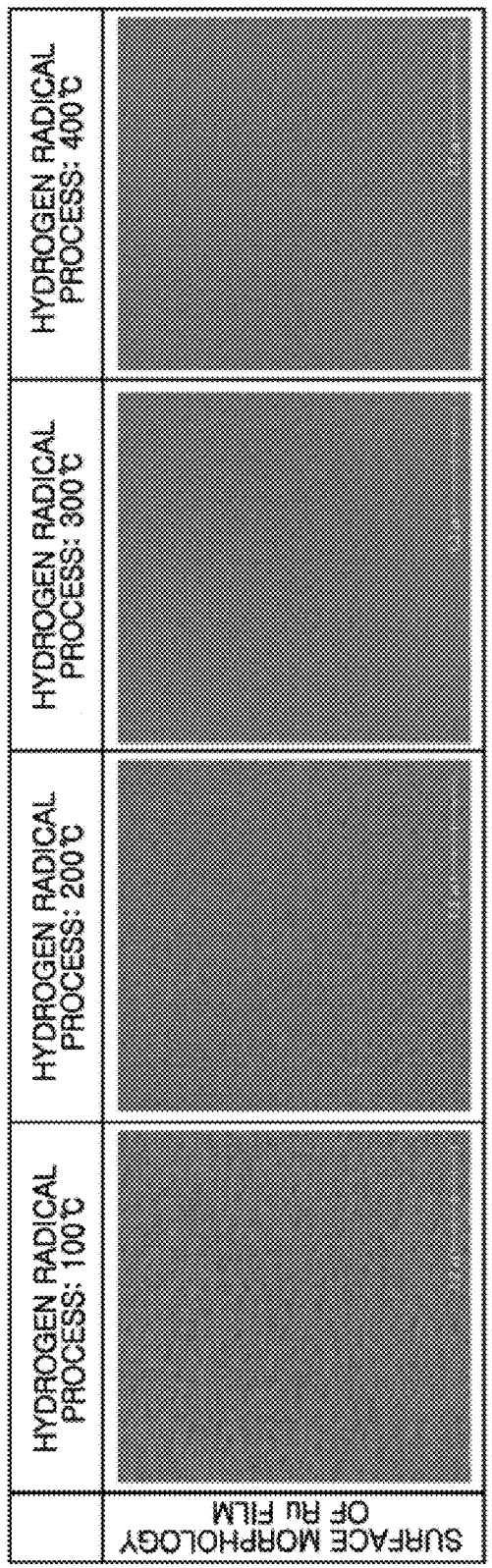
FIG. 10 depicts SEM pictures showing surface morphology of the Ru film when the hydrogen radical process is performed at 100° C., 200° C., 300° C. and 400° C.

Here, on a $SiO_2$ film formed by CVD using TEOS, a $MnO_x$ film was formed by ALD of 21 cycles at 130° C. by using an amide amino alkane-based manganese compound as an organic Mn compound, and a hydrogen radical process ($H_2R$) was performed for 300 seconds with a hydrogen concentration of 10.6% while changing the processing temperature thereof to 100° C., 200° C., 300° C. and 400° C. Thereafter, a Ru film was formed by CVD for seconds at 195° C. by using ruthenium carbonyl. SEM pictures showing surface morphology of the Ru film at that time are shown in FIG. 10. From FIG. 10, it has been found that as the temperature of the hydrogen radical process is increased, the surface smoothness of the Ru film becomes better.

Figure 11:
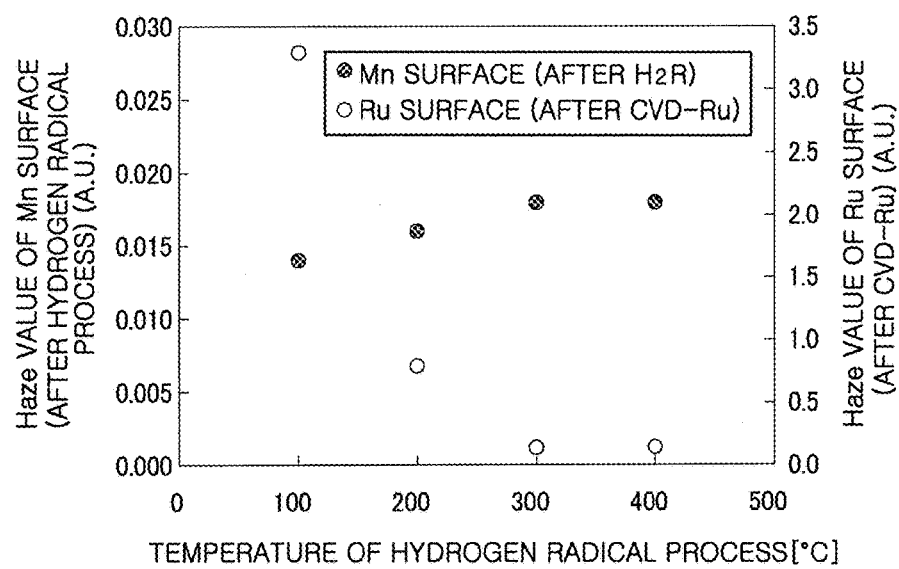
FIG. 11 is a graph showing relationships between a temperature of the hydrogen radical process, and Haze value of the surface of the $MnO_x$ film after the hydrogen radical process and Haze value of the surface of the Ru film.

FIG. 11 shows relationships between the temperature of the hydrogen radical process, and Haze value of the surface of the $MnO_x$ film after the hydrogen radical process and Haze value of the surface of the Ru film. From FIG. 11, it has been found that the Haze value of the surface of the $MnO_x$ film is hardly changed even when the temperature of the hydrogen radical process is changed, but the Haze value of the surface of the Ru film is decreased as the temperature of the hydrogen radical process is increased.

Figure 12:
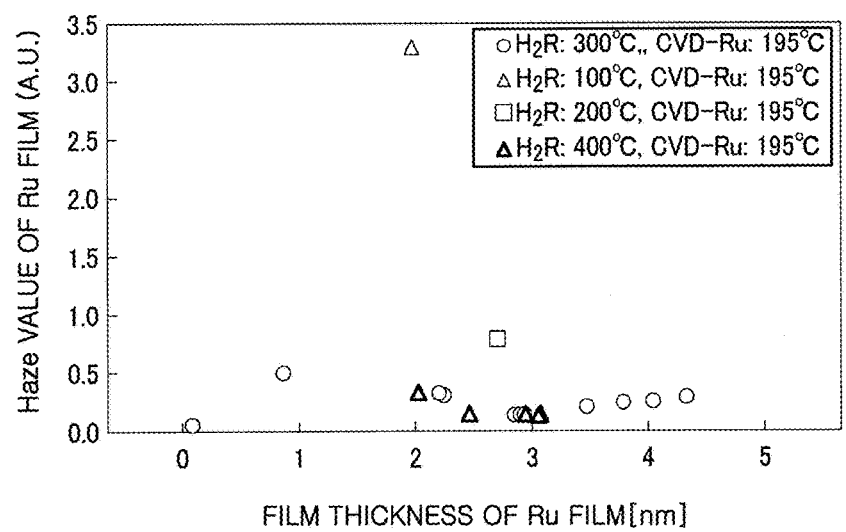
FIG. 12 is a graph showing a relationship between a film thickness of the Ru film and Haze value of the surface of the Ru film at the temperature of each hydrogen radical process.

Similarly, FIG. 12 shows, when the CVD-Ru film is formed at various film thicknesses after the hydrogen radical process is performed on the $MnO_x$ film while changing the temperature thereof similarly to the above, a relationship between the film thickness of the Ru film and the Haze value of the surface of the Ru film at the temperature of each hydrogen radical process. From FIG. 12, it has been found that the Haze value is the greatest when the temperature of the hydrogen radical process ($H_2R$) is 100° C. Further, the Haze value has a tendency to be lower at 300° C. and 400° C. than 200° C., and 300° C. and 400° C. are preferable to make the surface smoothness of the Ru film good.

Figure 13:
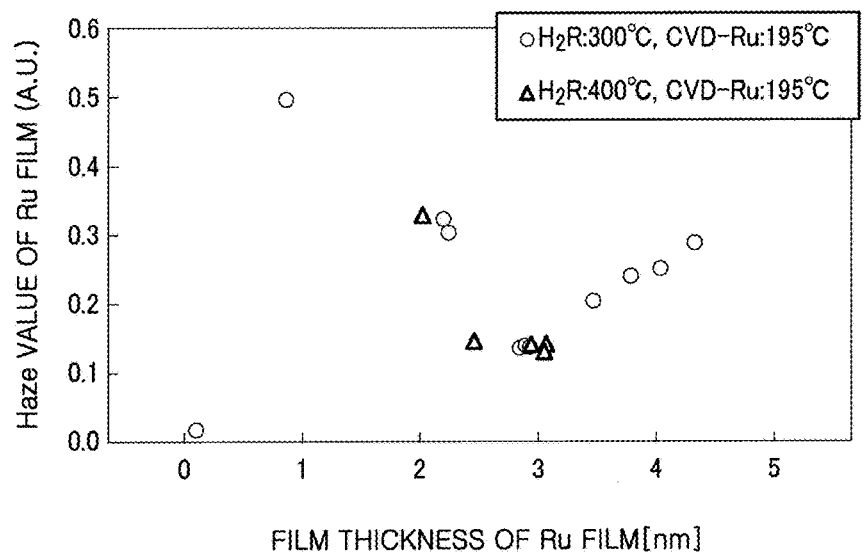
FIG. 13 is an enlarged graph showing only the results of the hydrogen radical processes at 300° C. and 400° C.

FIG. 13 is an enlarged graph showing only the results of the hydrogen radical processes at 300° C. and 400° C. in FIG. 12. From FIG. 13, it has been found that the surface smoothness of the Ru film has a tendency to be a little better at 400° C. than 300° C. Moreover, the mechanism of the film thickness and the Haze value of the Ru film showing such behavior will be later described in detail with reference to FIG. 17.

Next, an experiment for finding a proper processing time of the hydrogen radical process will now be described.

Here, a sample was manufactured in which a $SiO_2$ film is formed by CVD using TEOS, a $MnO_x$ film is formed on the $SiO_2$ film by ALD of 21 cycles at 130° C. by using an amide amino alkane-based manganese compound as an organic Mn compound, and then a Ru film is formed by CVD for 300 seconds at 180° C. by using ruthenium carbonyl after a hydrogen radical process is performed with a hydrogen concentration of 10.6% at 300° C. while changing the processing time thereof. In this regard, a relationship between the processing time of the hydrogen radical process and a film thickness of the Ru film is shown in FIG. 14, and a relationship between the processing time of the hydrogen radical process and Haze value of the Ru film is shown in FIG. 15.

Figure 14:
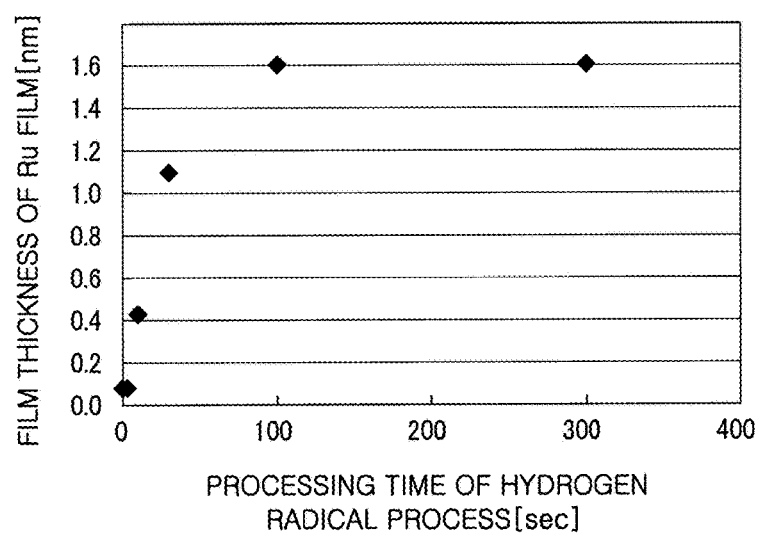
FIG. 14 is a graph showing a relationship between the processing time of the hydrogen radical process and the film thickness of the Ru film.
Figure 15:
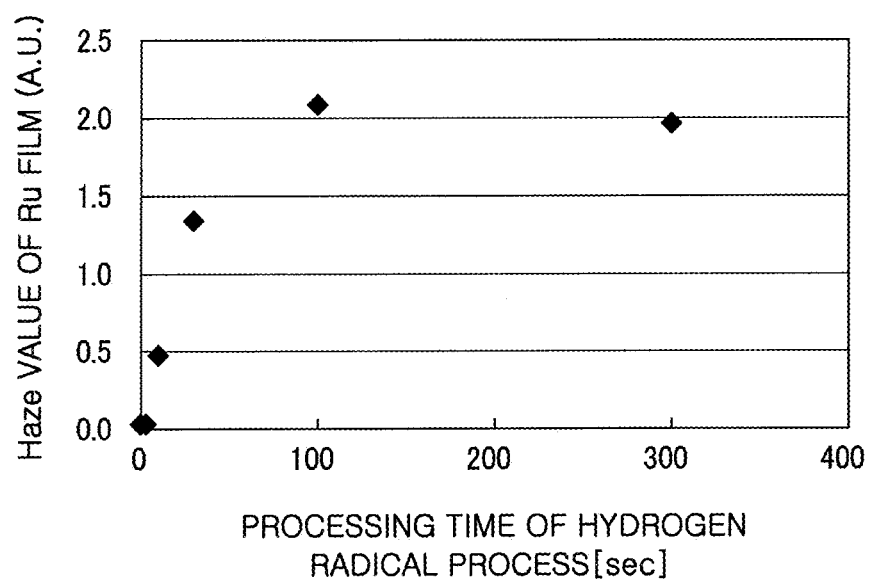
FIG. 15 is a graph showing a relationship between the processing time of the hydrogen radical process and Haze value of the Ru film.

As shown in FIGS. 14 and 15, both of the film thickness of the Ru film and the Haze value of the Ru film are small and have a tendency to sharply increase as time goes by until the processing time of the hydrogen radical process reaches 100 seconds. It is seen that in the processing time of 100 seconds or less, a nucleus formation of the Ru film is not sufficient and the Ru film is not sufficiently formed. That is, it is seen that in the hydrogen radical process for 100 seconds or less, a surface of the $MnO_x$ film is not sufficiently reduced and the nucleus formation of the Ru film is insufficient. The film thickness and Haze value of the Ru film are almost saturated at 100 seconds or more, but it is preferable that the hydrogen radical process is performed for 200 seconds or more, e.g., about 300 seconds for safety.

Next, description will be made on an experiment for finding out the fillability of Cu when changing the condition of the hydrogen radical process.

FIGS. 16A to 16E are cross-section TEM pictures showing the fillability of Cu when changing the condition of the hydrogen radical process. In FIG. 16A, a reference sample was used under a condition of the hydrogen radical process set as follows. RF supply power of remote plasma: 2 kW; Flow rate of $Ar/H_2$: 110/13 sccm (hydrogen concentration: 10.6%); Temperature: 300° C.; and Processing time: 300 seconds. In FIG. 16B, the flow rate of $Ar/H_2$ was changed to 40/20 sccm (hydrogen concentration: 33.3%). In FIG. 16C, the RF supply power was changed to 1 kW. In FIG. 16D, the processing time was changed to 30 seconds. In FIG. 16E, the temperature was changed to 100° C. A condition for the other films was the same as in the sample used in the experiment of FIGS. 14 and 15.

FIGS. 16A to 16C show a satisfactory fillability, and it has been found that the hydrogen concentration (hydrogen partial pressure) and the power of plasma do not highly affect the fillability. However, in FIG. 9D in which the processing time is shortened to 30 seconds and FIG. 9E in which the processing temperature is lowered to 100° C., the fillability has deteriorated. This is considered because in a case where the processing time of the hydrogen radical process is too short or the processing temperature is too low, a surface of the $MnO_x$ film is not sufficiently reduced and the formation of the Ru film is insufficient.

As for a gas supplied in the hydrogen radical process, hydrogen gas added with an inert gas such as Ar gas or the like is preferably used, and in this case, the hydrogen concentration is preferably set to 1 to 50%. A processing pressure of the hydrogen radical process is preferably set to 10 to 500 Pa, and more preferably to 20 to 100 Pa.

In order to prevent Mn from being again oxidized after the $H_2$ radical reduction process, it is preferable that an ultimate vacuum level of a chamber in which the $H_2$ radical process is performed and a transfer system through which a wafer is transferred is set to $5 \times 10^{-8}$ Torr or less. For the same purpose, it is preferable that the formation of a subsequent Ru film is performed within 60 minutes after the $H_2$ radical reduction process.

(Ru Film Formation)

Next, a process of forming the Ru film 206 serving as a layer to be wetted will be described.

The Ru film 206 can be properly formed by a thermal CVD by using ruthenium carbonyl ($Ru_3(CO)_{12}$) as a film-forming material. By doing so, the Ru film having high purity and thin thickness can be formed with high step coverage. The Ru film 206 may be formed by CVD by using another film-forming material other than the ruthenium carbonyl, e.g., a pentadienyl compound of ruthenium such as (cyclopentadienyl) (2, 4-dimethylpentadienyl) ruthenium, bis(cyclopentadienyl) (2, 4-methylpentadienyl) ruthenium, (2, 4-dimethylpentadienyl) (ethylcyclopentadienyl) ruthenium, or bis(2, 4-methylpentadienyl) (ethylcyclopentadienyl) ruthenium.

Since Ru has a high wettability to Cu, by forming Ru film as a base film for Cu, it is possible to obtain a good mobility of Cu when forming a next Cu film by PVD and to make it difficult to generate overhang that blocks an opening of the trench or via. However, even when forming the Ru film on the $MnO_x$ film as-deposited, a nucleus formation density of Ru is low, so that it is required to perform the hydrogen radical process on the surface of the $MnO_x$ film 205 and then form the Ru film on a reduced surface of the $MnO_x$ film. At this time, as described above, a film-forming condition of the $MnO_x$ film and a condition of the hydrogen radical process are defined such that a Ru film having a good surface state can be formed at a good film-forming rate even in fine patterns.

After performing the film-forming process of the $MnO_x$ film and the hydrogen radical process under a proper condition to form a good surface state, Ru-CVD is performed under a proper condition. By doing so, the Ru film having a good surface state can be formed thin and uniformly with high step coverage. Accordingly, Cu or Cu alloy can be reliably filled without generating void even in a fine trench or via. Further, since the Ru film is thin, the volume of Cu or Cu alloy in the trench or via can be made larger, so that it is possible to prevent an electric resistance value of a Cu wiring from increasing.

Figure 17:
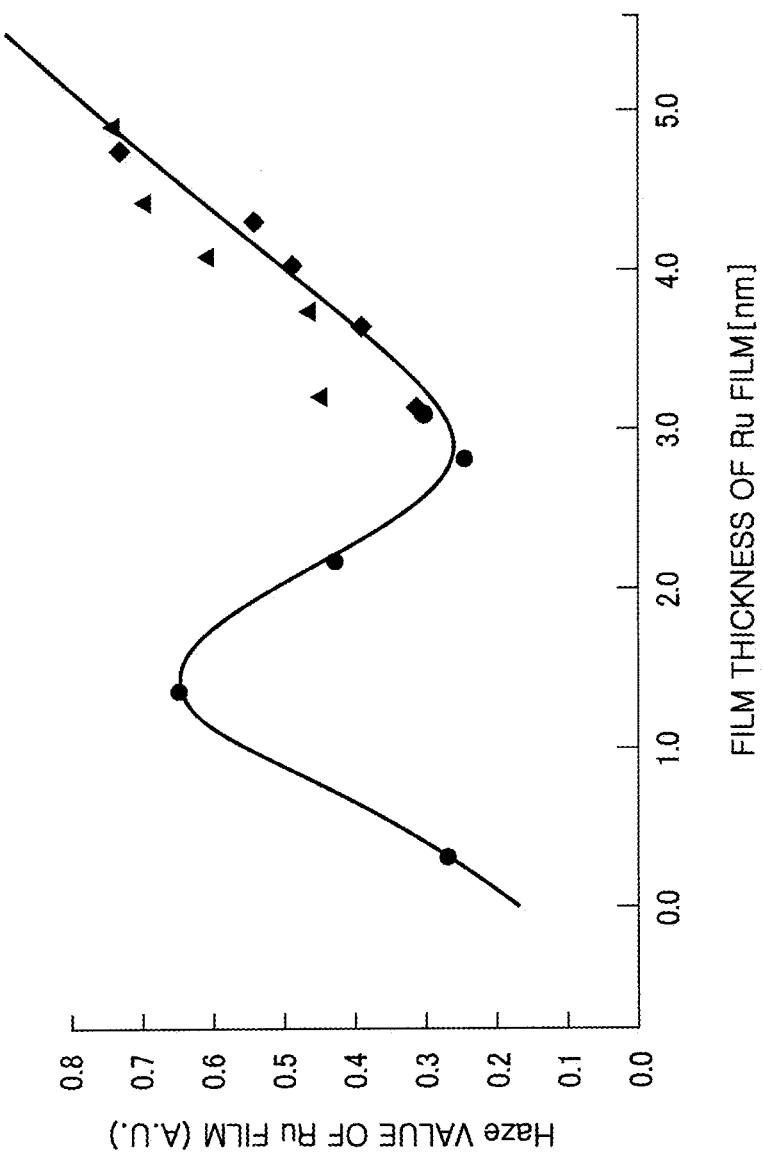
FIG. 17 is a graph showing a relationship between a film thickness of the Ru film and Haze value of a surface of the Ru film when the Ru film has been formed by Ru-CVD after performing the formation of the $MnO_x$ film and the hydrogen radical process under proper conditions.

FIG. 17 is a view showing a relationship between a film thickness of the Ru film and Haze value of a surface of the Ru film when the Ru film has been formed by CVD after performing the formation of the $MnO_x$ film and the hydrogen radical process under the above-described proper conditions. As shown in FIG. 17, in a film-forming initial stage of a CVD-Ru film, growth of nucleuses is dominant, and as the film thickness of the Ru film increases, the Haze value also increases. If adjacent nucleuses are connected to each other by the growth, the Haze value becomes a maximum value, and thereafter the Haze value decreases. If a continuous film is formed by the connection of the adjacent Ru nucleuses, the Haze value becomes a minimum value. Thereafter, since facets grow with the growth of the Ru film, the Haze value increases with the increase of the film thickness. In order to allow the fillability of Cu to be improved, it is required that the CVD-Ru film becomes a continuous film and the Haze value becomes smaller. Such a Ru film has a film thickness that is a little thicker than a film thickness at which the Haze value is a minimum, and in an example of FIG. 17, it is a region in which the film thickness of the Ru film is as very thin as 2.5 to 4.1 nm. Further, FIG. 17 shows an example in which a Ru-CVD film-forming temperature is 175° C., but by setting the Ru-CVD film-forming temperature to a little higher value (e.g., 195° C. or the like), a continuous CVD-Ru thin film having a small Haze value can be obtained even in a region in which the film thickness of the Ru film is as thinner as 1.8 to 3.3 nm. That is to say, by performing Ru-CVD after performing the formation of the $MnO_x$ film and the hydrogen radical process under the above-described preferable conditions, it is possible to form an ideal CVD-Ru film that is a continuous film having a good surface state (small surface roughness) and a thin thickness of 1.8 to 4.1 nm. If the film-forming condition of the $MnO_x$ film and the condition of the hydrogen radical process is not within the preferable conditions, the relationship between the film thickness and the Haze value becomes different from that of the graph shown in FIG. 17, and for example, may be shifted to the upper side and the right side, so that it becomes difficult to form a Ru film such that the Ru film becomes a continuous film having a good surface state and a thin thickness.

A desired Ru film can be formed by properly adjusting a film-forming condition of the Ru film after setting a film-forming condition of the $MnO_x$ film 205 and a condition of the hydrogen radical process to the preferable ranges as described above. However, at this time, as to the film-forming condition of the Ru film, it is preferable that ruthenium carbonyl ($Ru_3(CO)_{12}$) is used as a film-forming material, a film-forming temperature (wafer temperature) is set to 170° C. to 230° C., and CVD is performed. In this range, Ru-CVD is reaction-limited, so that it is possible to form a film having a good surface state and a high in-plane uniformity. The temperature range is preferably set to 175° C. to 205° C. Further, in view of ensuring a better smoothness of the surface of the Ru film, the film-forming temperature is more preferably set to a range of 190° C. to 200° C. and particularly to 195° C. At the film-forming temperature of 195° C., the processing time is preferably set to 75 to 120 seconds (which corresponds to the Ru film thickness of 2.5 to 3.8 nm). In case of conversion to Ru having a lattice constant of 0.43 nm in c-axis direction, this corresponds to to 9 layers of Ru. The Ru film has a good surface smoothness when the processing time is about 75 seconds, and as the Ru film becomes thicker in the above range, the fillability of Cu is improved to enhance the electric characteristic and the wiring shape thereof.

By forming the Ru film having a high surface smoothness, it is possible to increase the wettability to Cu and to realize a good Cu filling.

Description will be made on an experiment for finding out a proper temperature when forming the Ru film.

Figure 18:
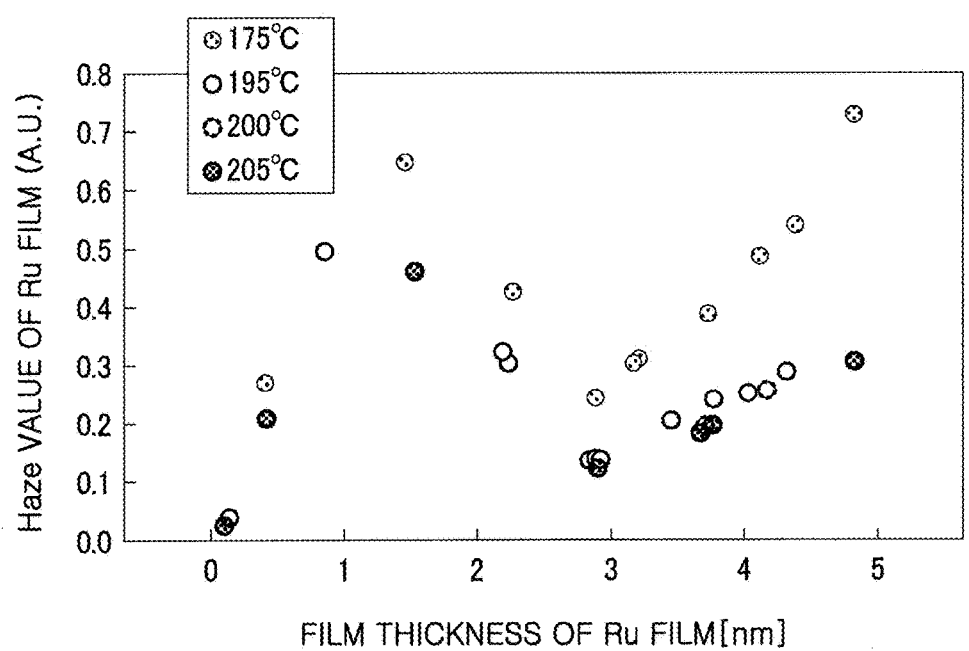
FIG. 18 is a graph showing a relationship between the film thickness of the Ru film and Haze value of the surface of the Ru film at each film-forming temperature in the Ru-CVD.

Here, on a $SiO_2$ film formed by CVD using TEOS, a $MnO_x$ film was formed by ALD of 21 cycles at 130° C. by using an amide amino alkane-based manganese compound as an organic Mn compound, and a hydrogen radical process was performed at 300° C. with a hydrogen concentration of 10.6%. Thereafter, a Ru film was formed by CVD at 175 to 205° C. to have various film thicknesses by using ruthenium carbonyl. FIG. 18 shows a relationship between the film thickness of the Ru film and Haze value of the surface of the Ru film at each film-forming temperature at that time. From FIG. 18, it has been found that as the film-forming temperature of the Ru film is increased, the Haze value of the surface of the Ru film is decreased to obtain a good surface smoothness of the Ru film.

Meanwhile, it has been found that when the Ru film becomes thin, at 205° C. of the film-forming temperature of the Ru film, the film thickness has a profile in which the film thickness in a central portion of the wafer is small and the film thickness in a peripheral portion of the wafer is large. This is because the film-forming temperature of 205° C. is too high to be reaction-limited with respect to the entire surface of the wafer. At the film-forming temperature of 200° C. or less, the in-plane film thickness is substantially uniform, but at the film-forming temperature of 195° C., the in-plane film thickness is the most uniform.

From the above-description, it has been found that when the film-forming temperature of the Ru film is 195° C. and 200° C., it is possible to obtain a Ru film having a good surface smoothness and a high in-plane uniformity of film thickness, and to obtain a better result at 195° C. than 200° C.

Further, a pressure when forming the Ru film by CVD is preferably set to 1.3 to 133 Pa.

(Cu Film Formation)

Next, a process of forming the Cu-based film 207 will be described.

The Cu-based film 207 is formed, as described above, by PVD that is a dry process. At this time, iPVD which forms a film while attracting ions is preferably used.

In a case of a general PVD film-forming process, when filling the Cu-based film 207 in the trench or via, overhang that blocks the opening of the trench or via may be easily generated by agglomeration of Cu. However, by using iPVD, a bias power applied to a wafer is adjusted to control a film-forming action of Cu ions and an etching action by ions (Ar ions) in a plasma-generating gas. By doing so, Cu or Cu alloy is moved on the Ru film 206, so that the generation of the overhang can be suppressed. Consequently, a satisfactory fillability can be obtained even in a trench or via having a small opening. At this time, in a viewpoint of obtaining a good fillability by allowing Cu to have mobility, it is preferable that a high-temperature process (65 to 400° C.) is performed so as to allow Cu to migrate. In this case, the temperature is preferably set to 230 to 350° C., and more preferably to about 300° C. As such, by forming a film by PVD in a high-temperature process, Cu grain can be grown, so that it is possible to make grain boundary scattering small and make resistance of a Cu wiring low. Further, as described above, the Ru film 206 having a high wettability to Cu or Cu alloy, which serves as a base film for the Cu-based film 207, can be formed thin and uniformly while having a good surface state. Therefore, Cu or Cu alloy is not agglomerated but moves on the Ru film to thereby suppress the generation of overhang even in a fine recess. Consequently, the Cu-based film 207 (Cu or Cu alloy) can be reliably filled without generating a void.

A pressure (process pressure) in the processing chamber when forming the Cu-based film is preferably set to 0.133 to 13.3 Pa, and more preferably, to 4.66 to 12.0 Pa.

Cu alloy used as the Cu-based film 207 representatively includes Cu—Al and Cu—Mn. Further, as another Cu alloy, there may be used Cu—Mg, Cu—Ag, Cu—Sn, Cu—Pb, Cu—Zn, Cu—Pt, Cu—Au, Cu—Ni, Cu—Co, Cu—Ti or the like.

As described above, in accordance with the present embodiment, the $MnO_x$ film 205 that can be formed thin as a self-formed barrier is formed by ALD, a surface of the $MnO_x$ film 205 is reduced by performing the hydrogen radical process on the surface of the $MnO_x$ film 205, the Ru film 206 is formed by CVD, and the Cu-based film 207 is formed on the Ru film 206. A film-forming condition of the $MnO_x$ film (specifically, a film thickness of the $MnO_x$ film (the number of cycles) and a film-forming temperature) and a condition of the hydrogen radical process (specifically, processing time and a processing temperature) are defined such that nucleus formation of the Ru film 206 is facilitated to allow the Ru film 206 to have a smooth surface state. Therefore, the Ru film having a good surface state is formed as a continuous film having a desired film thickness on the $MnO_x$ film, so that the Cu-based film 207 can be filled with a good fillability when filling the Cu-based film 207 in the trench 203 or the via 204.

Further, by using the $MnO_x$ film as a barrier film, the $MnO_x$ film can be formed thin as a self-formed barrier, and the Ru film can also be formed further thin and uniformly. Accordingly, it is possible to maximize a volume of Cu in a recess such as a trench, a via or the like and make resistance of the Cu wiring low. Moreover, since Cu is filled by iPVD at a high temperature, the Cu grain can be made larger and the grain boundary scattering can be made smaller. This point also contributes to the low resistance of the Cu wiring.

In addition, by decreasing the ALD cycle number for the $MnO_x$ film to set a high silicate ratio condition, it is possible to obtain good electrical characteristics such as leakage characteristics, and a smooth wiring pattern.

EXPERIMENTS

Next, description will be made on experiments for verifying the effect of the present embodiment.

Experiment 1

Figure 19:
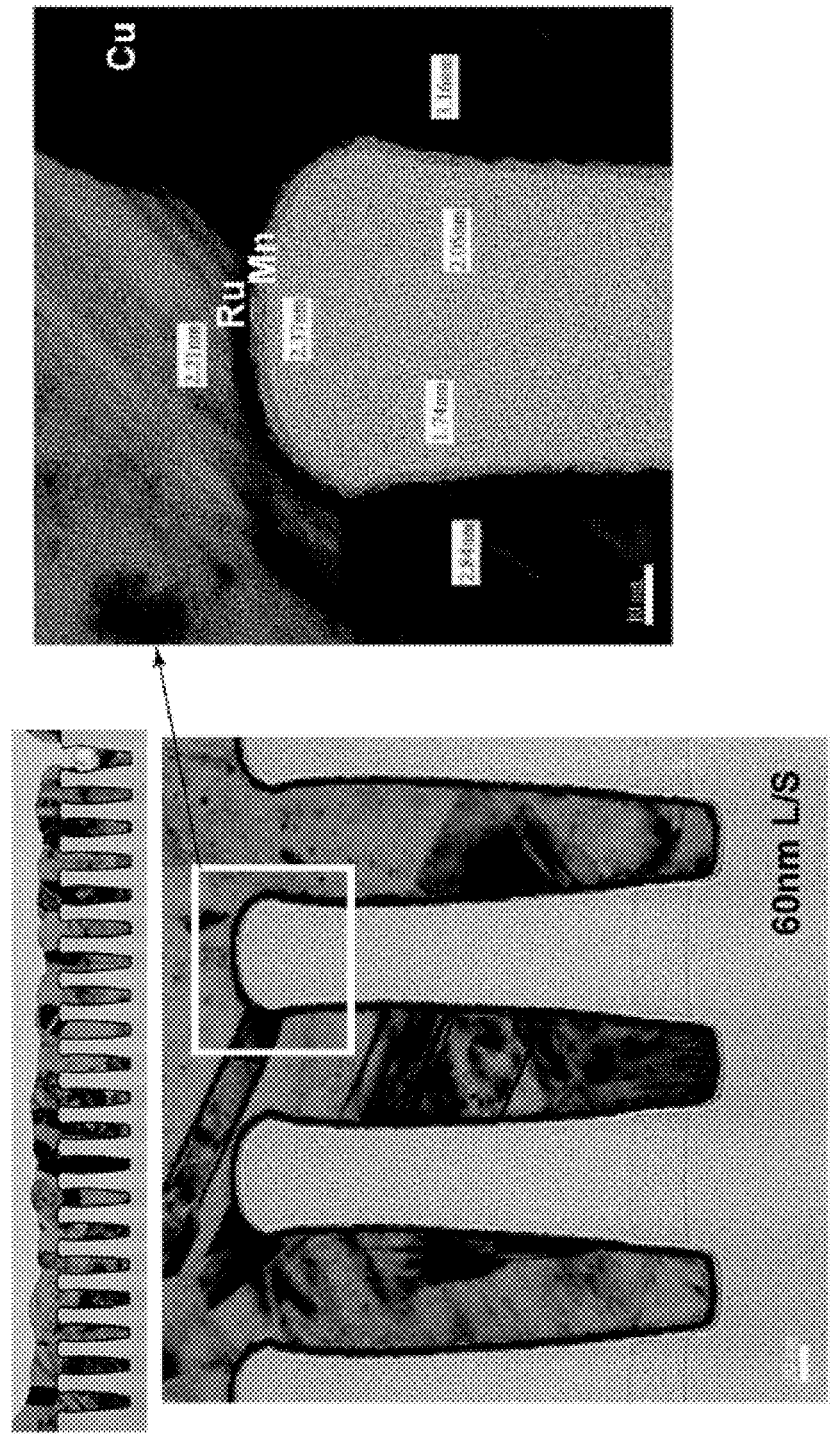
FIG. 19 depicts TEM pictures showing a section of a sample which has been subjected to the formation of $MnO_x$ film, the hydrogen radical process, the formation of Ru film and the filling of Cu film in Experiment 1.

In this experiment, a SiOC film was formed as a low-k film on a silicon wafer, a trench was formed in a pattern having a line/space of 60 nm/60 nm, a $MnO_x$ film was formed (with film thickness set to 2.1 nm) by ALD of 30 cycles at 130° C. by using an amide amino alkane-based manganese compound as an organic Mn compound and using $H_2O$ (water vapor) as an oxygen-containing gas, the hydrogen radical process was performed for 300 seconds at 300° C. by using remote plasma, a Ru film was formed (with film thickness set to 3.3 nm) by CVD for 300 seconds at 175° C. by using ruthenium carbonyl, and a Cu film was formed (with film thickness set to 150 nm) by iPVD at 300° C. to fill Cu in the trench. Cross-section TEM pictures for this sample are shown in FIG. 19. From FIG. 19, it has been found that the Ru film can be formed as a thin continuous film having a smooth surface state, thereby obtaining a very satisfactory Cu fillability.

Experiment 2

In this experiment, a SiOC film was formed as a low-k film on a silicon wafer, a trench was formed in a pattern having a line/space of 60 nm/60 nm, a $MnO_x$ film was formed (with film thickness set to 1.5 or 2.1 nm) by ALD of 21 or cycles at 130° C. by using an amide amino alkane-based manganese compound as an organic Mn compound and using $H_2O$ (water vapor) as an oxygen-containing gas, the hydrogen radical process was performed for 300 seconds at 300° C. or 400° C. by using remote plasma, a Ru film was formed (with film thickness set to 2.9 or 3.8 nm) by CVD for 80 or 120 seconds at 195° C. by using ruthenium carbonyl, and a Cu film was formed (with film thickness set to 150 nm) by iPVD at 300° C. to fill Cu in the trench. In this way, samples A, B and C were prepared. The conditions of forming each sample were as follows.

<Sample A>

ALD cycle number for $MnO_x$ film: 30 (set film thickness: 2.1 nm)

Processing temperature of hydrogen radical process: 300° C.

Film-forming time of Ru film: 120 sec (set film thickness: 3.8 nm)

<Sample B>

ALD cycle number for $MnO_x$ film: 30 (set film thickness: 2.1 nm)

Processing temperature of hydrogen radical process: 400° C.

Film-forming time of Ru film: 80 sec (set film thickness: 2.9 nm)

Figure 21:
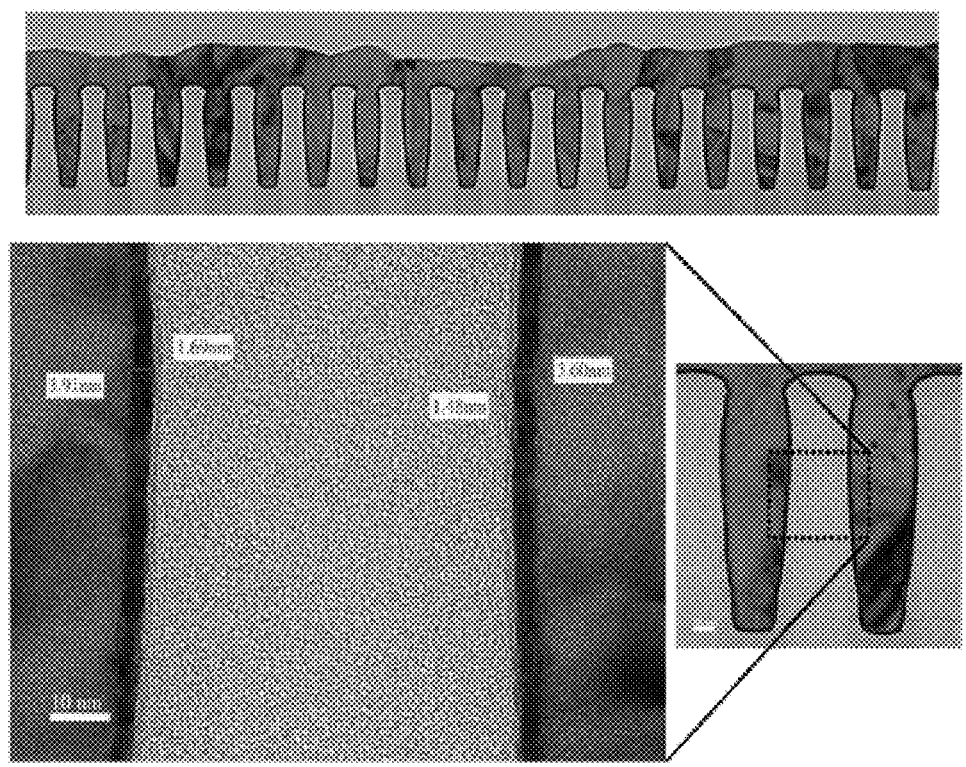
FIG. 21 depicts enlarged TEM pictures showing the section of the sample C in FIG. 20.

<Sample C>
ALD cycle number for MnO$_x$ film: 21 (set film thickness: 1.5 nm)
Processing temperature of hydrogen radical process: 400° C.
Film-forming time of Ru film: 120 sec (set film thickness: 3.8 nm)
TEM pictures of sections of the samples are shown in FIG. 20. As shown in FIG. 20, all of the samples have an excellent fillability of Cu. FIG. 21 depicts enlarged TEM pictures showing the section of the sample C in FIG. 20. In the sample C, by setting the film-forming temperature of the Ru film to 195° C., the surface smoothness of the Ru film becomes better and the ratio of silicate becomes greater than those in Experiment 1. Further, the Ru film becomes thicker, so that an excellent fillability can be obtained.

Experiment 3

In this experiment, a SiO$_2$ film was formed on a silicon wafer by CVD using TEOS as an interlayer insulating film, a pattern for electrical characteristics was formed with a line/space of 60 nm/60 nm, a MnO$_x$ film was formed as a barrier film by ALD at 130° C. by using an amide amino alkane-based manganese compound, the hydrogen radical process was performed with a hydrogen concentration of 10.6% for 300 seconds at a certain temperature by using remote plasma of 2 kW, and then a Ru film was formed by CVD using ruthenium carbonyl. subsequently, Cu was filled by iPVD at 300° C. and CMP was performed to form a Cu wiring pattern for electrical characteristics. The conditions of forming the Cu wiring were the following #1 to #6.
<#1 and #2>
ALD cycle number for MnO$_x$ film: 30 (set film thickness: 2.1 nm)
Processing temperature of hydrogen radical process: 300° C.
Film-forming temperature of Ru film: 175° C.
Film-forming time of Ru film: 300 sec (set film thickness: 2.7 nm)
Further, in #3 to #6, with respect to #1 and #2, the conditions of forming the Ru film were changed and, in some of #3 to #6, the ALD cycle number for MnO$_x$ film and the processing temperature of hydrogen radical process were changed.
<#3>
ALD cycle number for MnO$_x$ film: 30 (set film thickness: 2.1 nm)
Processing temperature of hydrogen radical process: 300° C.
Film-forming temperature of Ru film: 195° C.
Film-forming time of Ru film: 80 sec (set film thickness: 2.9 nm)
<#4>
ALD cycle number for MnO$_x$ film: 30 (set film thickness: 2.1 nm)
Processing temperature of hydrogen radical process: 300° C.
Film-forming temperature of Ru film: 195° C.
Film-forming time of Ru film: 120 sec (set film thickness: 3.8 nm)
<#5>
ALD cycle number for MnO$_x$ film: 21 (set film thickness: 1.5 nm)
Processing temperature of hydrogen radical process: 400° C.
Film-forming temperature of Ru film: 195° C.
Film-forming time of Ru film: 80 sec (set film thickness: 2.9 nm)
<#6>
ALD cycle number for MnO$_x$ film: 21 (set film thickness: 1.5 nm)
Processing temperature of hydrogen radical process: 400° C.
Film-forming temperature of Ru film: 195° C.
Film-forming time of Ru film: 120 sec (set film thickness: 3.8 nm)
In the above #1 to #6, wiring resistance (R), electrical capacitance (C), R·C product, leakage current were measured at 89 points on the wafer and average values and deviations thereof were obtained. The results are shown in FIGS. 22 to 25.

Figure 22:
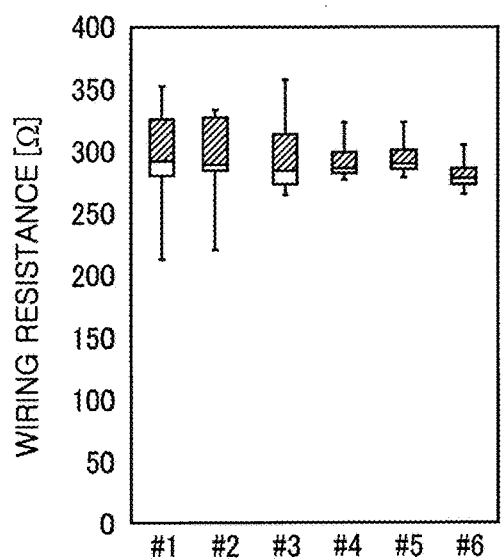
FIG. 22 is a graph showing, when measuring wiring resistances of conventional examples #1 and #2 and test examples #3 to #6 in Experiment 3, average values and deviations of the wiring resistances.

With respect to the wiring resistance (R), as shown in FIG. 22, in #3 to #6, the deviation (in-plane distribution) was smaller than that in #1 and #2. Further, in #3 to #6, by decreasing the ALD cycle number for MnO$_x$ film and increasing the processing temperature of the hydrogen radical process to 400° C. to obtain a high silicate ratio or by increasing the film thickness of the Ru film to 3.8 nm, the deviation of the wiring resistance became smaller. Particularly, in #6 where the ALD cycle number for MnO$_x$ film was decreased and the film thickness of the Ru film was increased, the deviation of the wiring resistance was small.

Figure 23:
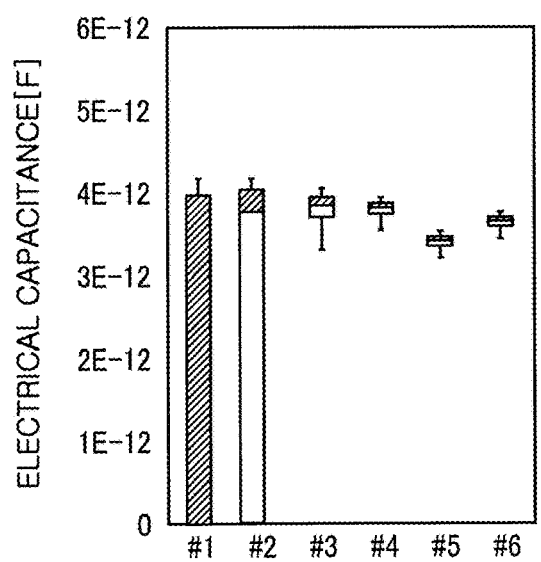
FIG. 23 is a graph showing, when measuring electric capacitances of the conventional examples #1 and #2 and the test examples #3 to #6 in Experiment 3, average values and deviations of the electric capacitances.

With respect to the electrical capacitance (C), as shown in FIG. 23, the deviation thereof was great in #1 and #2 whereas, in #3 to #6, the deviation (in-plane distribution) was significantly improved compared with that in #1 and #2. Further, as similar to the wiring resistance, by decreasing the ALD cycle number for MnO$_x$ film and increasing the processing temperature of the hydrogen radical process to 400° C. to obtain a high silicate ratio or by increasing the film thickness of the Ru film to 3.8 nm, the deviation of the electrical capacitance became smaller. Particularly, in #6, the deviation of the electrical capacitance was small.

Figure 24:
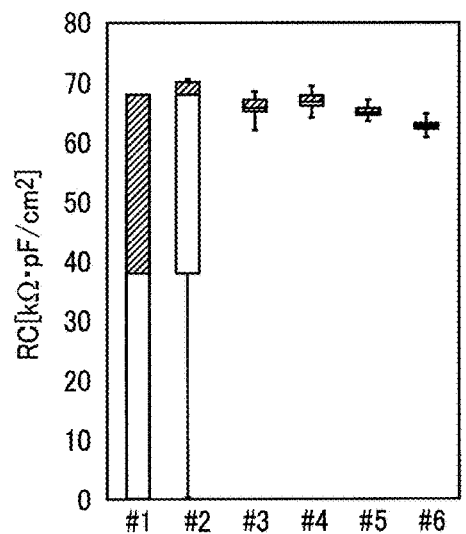
FIG. 24 is a graph showing, when measuring R·C products of the conventional examples #1 and #2 and the test examples #3 to #6 in Experiment 3, average values and deviations of the R·C products.

With respect to the R·C product, as shown in FIG. 24, the deviation of the R·C product was great in #1 and #2 whereas, in #3 to #6, the deviation (in-plane distribution) was significantly improved compared with that in #1 and #2. Further, in the R·C product, by decreasing the ALD cycle number for MnO$_x$ film and increasing the processing temperature of the hydrogen radical process to 400° C. to obtain a high silicate ratio or by increasing the film thickness of the Ru film to 3.8 nm, the deviation of the R·C product became smaller. Particularly, in #6, the deviation of the R·C product was small. The R·C product value in #6 was better than that in a conventional Cu wiring obtained by using TaN/Ta barrier.

Figure 25:
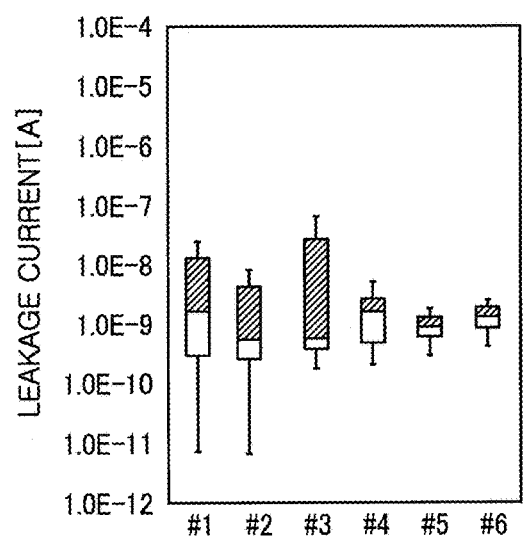
FIG. 25 is a graph showing, when measuring leakage currents of the conventional examples #1 and #2 and the test examples #3 to #6 in Experiment 3, average values and deviations of the leakage currents.

With respect to the leakage current, as shown in FIG. 25, in #3 to #6, the deviation (in-plane distribution) was smaller than that in #1 and #2. Further, among #3 to #6, the leakage current was improved in #5 and #6 of a high silicate ratio condition compared with #3 and #4.

Figure 26:
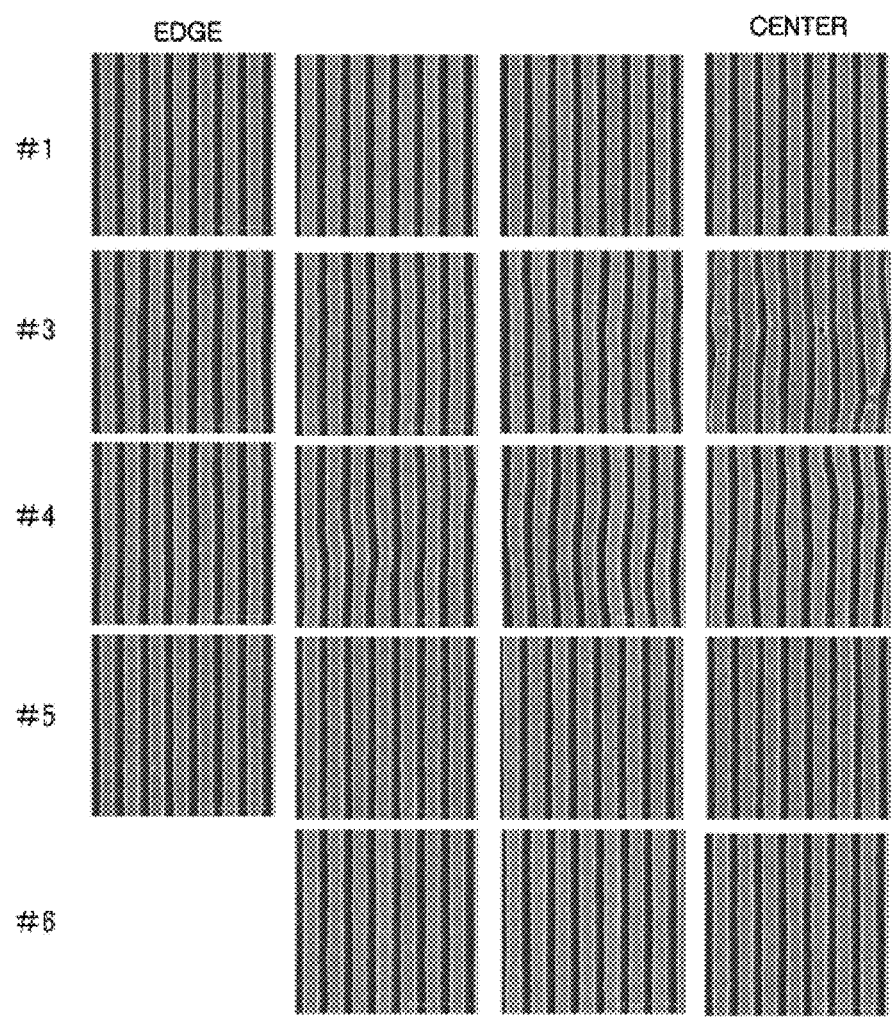
FIG. 26 depicts SEM pictures showing planar shapes of Cu wiring patterns for measurement of electrical characteristics in the examples #1, and #3 to #6 in Experiment 3.

Next, with respect to #1 and #3 to #6, planar shape of the Cu wiring pattern for electrical characteristic measurement was observed with SEM. The results are shown in FIG. 26. As shown in FIG. 26, in #1, the Cu wiring is waved and distorted, that is, wiggling is generated. Although wiggling is also generated in #3 and #4, wiggling is improved in #5 and #6 of a high silicate ratio condition.

The experiment was performed on wide Cu wiring patterns for electrical characteristic measurement which are formed under the same conditions of #1 to #6 except that line/space thereof is 100/100 nm. In #1 and #3 and #4 of a low silicate ratio, wiggling is generated and depression or hollow metal is generated in the Cu wiring. In contrast, in #5 and #6 of a high silicate ratio, wiggling is improved and particularly in #6 of a high silicate ratio and a large film thickness of the Ru film, no hollow metal is generated. Further, in case of wide wiring, under the condition of a low silicate ratio and a Ru film thickness of 2.9 nm, a deviation in the electrical characteristics may be generated even in the above-described range. However, by increasing the film thickness of the Ru film, yields of wiring resistance (R) and electrical capacitance (C) of the wide wiring are somewhat improved, and by making the silicate ratio high, the deviation of the leakage current can be surpressed even in the wide wiring. In #6 satisfying the above conditions, in the wide wiring of 100 nm, all the electrical characteristics were good.

(Desirable Film-Forming System for Implementing the Embodiment)

Figure 27:
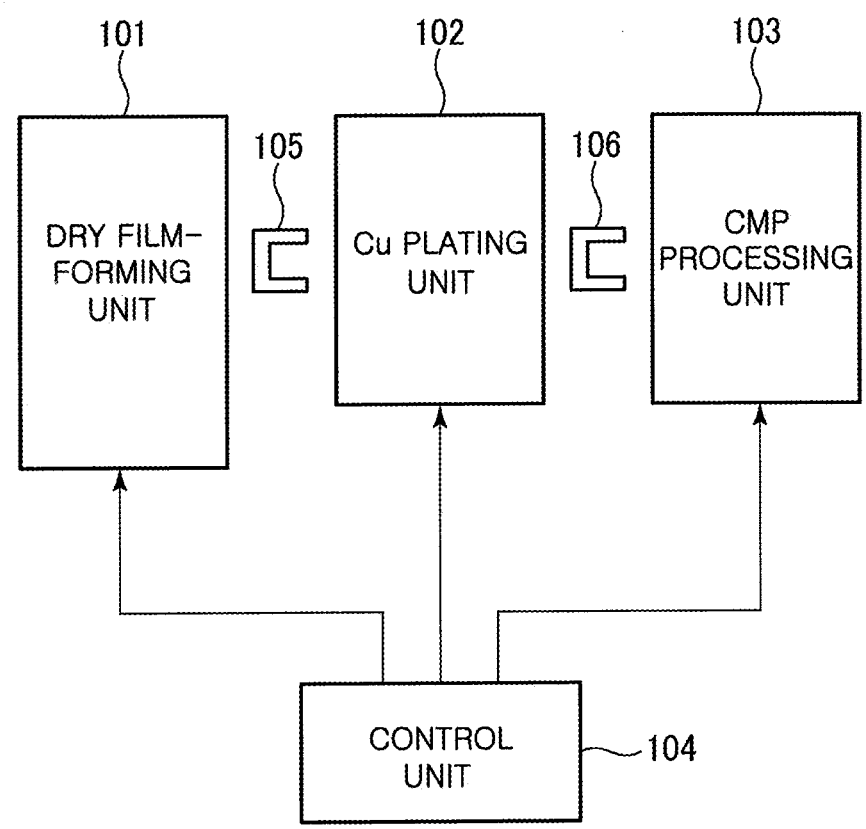
FIG. 27 is a block diagram showing a schematic configuration of a Cu wiring manufacturing system that is proper to implement the Cu wiring manufacturing method in accordance with the embodiment.
Figure 28:
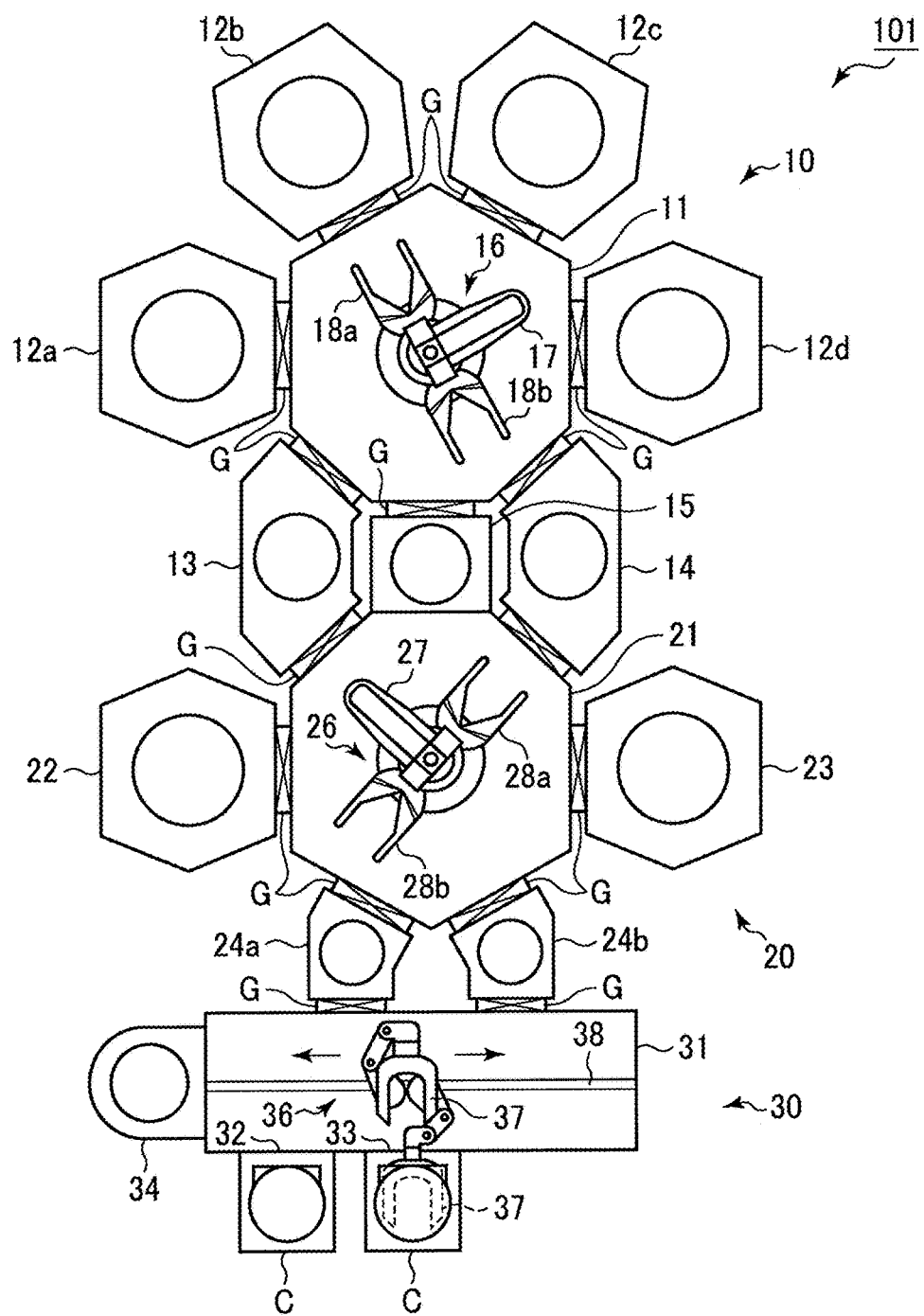
FIG. 28 is a plan view showing an example of a dry film-forming processing unit in the Cu wiring manufacturing system of FIG. 27.
Figure 29:
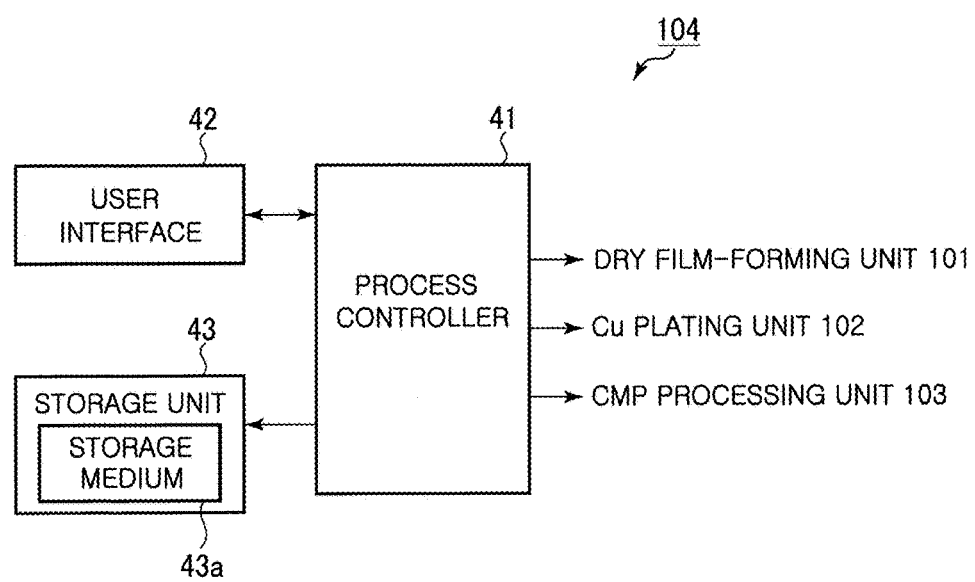
FIG. 29 is a block diagram showing a control unit of the Cu wiring manufacturing system of FIG. 27.

Next, description will be made on a film-forming system that is desirable to implement the Cu wiring manufacturing method in accordance with the embodiment. FIG. 27 is a block diagram showing a schematic configuration of a Cu wiring manufacturing system that is desirable to implement the Cu wiring manufacturing method in accordance with the embodiment. FIG. 28 is a plan view showing an example of a dry film-forming unit 101 that is a main unit of the film-forming system of FIG. 27. FIG. 29 is a block diagram showing a control unit 104 of the film-forming system of FIG. 27.

As shown in FIG. 27, a Cu wiring manufacturing system 100 includes: a dry film-forming unit 101 for performing processes from a degas process to a film-forming process of a Cu-based film; a Cu plating unit 102 for forming an additional Cu layer; a CMP processing unit 103 for performing a CMP process; a control unit 104 for controlling respective components of the Cu wiring manufacturing system 100; a first carrier transfer device 105 for transferring a carrier C in which wafers W are accommodated between the dry film-forming unit 101 and the Cu plating unit 102; and a second carrier transfer device 106 for transferring the carrier C in which wafers W are accommodated between the Cu plating unit 102 and the CMP processing unit 103.

As shown in FIG. 28, the dry film-forming processing unit 101 includes: a first processing section 10 for performing the degas process, a formation of a $MnO_x$ film, and a hydrogen radical process; a second processing section for forming a Ru film and the Cu-based film; and a loading/unloading section 30.

The first processing section 10 includes a first vacuum transfer chamber 11, four $MnO_x$ film forming apparatuses 12a to 12d connected to wall portions of the first vacuum transfer chamber 11, a degas chamber 13, and a hydrogen radical processing apparatus 14. The hydrogen radical processing apparatus 14 can also perform a degas process of the wafer W. Connected to a wall portion of the first vacuum transfer chamber 11 between the degas chamber 13 and the hydrogen radical processing apparatus 14 is a delivery chamber 15 through which the wafer W is transferred between the first vacuum transfer chamber 11 and a second vacuum transfer chamber 21.

The four $MnO_x$ film forming apparatuses 12a to 12d, the degas chamber 13, the hydrogen radical processing apparatus 14 and the delivery chamber 15 are respectively connected to corresponding sides of the first vacuum transfer chamber 11 through gate valves G. They communicate with or are isolated from the first vacuum transfer chamber 11 by opening or closing the corresponding gate valves G.

An inside of the first vacuum transfer chamber 11 is maintained at a predetermined vacuum atmosphere, and a first transfer mechanism 16 for transferring the wafer W is provided in the inside of the first vacuum transfer chamber 11. The first transfer mechanism 16 is arranged at a substantially central position in the first vacuum transfer chamber 11. The first transfer mechanism 16 has a rotatable and extensible/contractible portion 17 which can rotate, extend and contract, and two holding arms 18a and 18b for holding the wafer W which are provided at a leading end of the rotatable and extensible/contractible portion 17. The first transfer mechanism 16 is configured to load and unload the wafer W with respect to the $MnO_x$ film forming apparatuses 12a to 12d, the degas chamber 13, the hydrogen radical processing apparatus 14 and the delivery chamber 15.

The second processing section 20 includes a second vacuum transfer chamber 21, a Ru film-forming device 22 and a Cu-based film-forming device 23. The Ru film-forming device 22 and the Cu-based film-forming device 23 are connected to opposite walls of the second vacuum transfer chamber 21, respectively.

The degas chamber 13 and the hydrogen radical processing apparatus 14 are connected to two walls of the second vacuum transfer chamber 21 adjacent to the first processing section 10. The delivery chamber 15 is connected to a wall of the second vacuum transfer chamber 21 between the degas chamber 13 and the hydrogen radical processing apparatus 14. That is, the degas chamber 13, the hydrogen radical processing apparatus 14 and the delivery chamber 15 are all provided between the first vacuum transfer chamber 11 and the second vacuum transfer chamber 21, and the degas chamber 13 and the hydrogen radical processing apparatus 14 are arranged at opposite sides of the delivery chamber 15. Connected to two walls of the second vacuum transfer chamber 21 adjacent to the loading/unloading section 30 are load-lock chambers 24a and 24b through which atmospheric transfer and vacuum transfer can be performed.

The Ru film-forming apparatus 22, the Cu-based film-forming apparatus 23, the degas chamber 13, the hydrogen radical processing apparatus 14 and the load-lock chambers 24a and 24b are respectively connected to corresponding walls of the second vacuum transfer chamber 21 through gate valves G. They communicate with the second vacuum transfer chamber 21 by opening the corresponding gate valves G and are isolated from the second vacuum transfer chamber 21 by closing the corresponding gate valves G. The delivery chamber 15 is connected to the second vacuum transfer chamber 21 with no gate valve therebetween.

An inside of the second vacuum transfer chamber 21 is maintained at a predetermined vacuum atmosphere. In the inside of the second vacuum transfer chamber 21, there is provided a second transfer mechanism 26 for transferring the wafer W with respect to the Ru film-forming apparatus 22, the Cu-based film-forming apparatus 23, the degas chamber 13, the hydrogen radical processing apparatus 14, the load-lock chambers 24a and 24b and the delivery chamber 15. The second transfer mechanism 26 is arranged at a substantially central position in the second vacuum transfer chamber 21. The second transfer mechanism 26 has a rotatable and extensible/contractible portion 27 which can rotate, extend and contract, and two holding arms 28a and 28b for holding the wafer W which are provided at a leading end of the rotatable and extensible/contractible portion 27. The holding arms 28a and 28b are attached to the rotatable and extensible/contractible portion 27 to face the opposite directions.

The loading/unloading section 30 is arranged opposite to the second processing section 20 with the load-lock chambers 24a and 24b interposed therebetween, and has an atmospheric transfer chamber 31 connected to the load-lock chambers 24a and 24b. At an upper portion of the atmospheric transfer chamber 31, a filter (not shown) for forming a downflow of a clean air is provided. Gate valves G are provided at a wall portion between the atmospheric transfer chamber 31 and the load-lock chambers 24a and 24b. At a wall portion opposite to the wall portion of the atmospheric transfer chamber 31 connected to the load-lock chambers 24a and 24b, there are provided two connection ports 32 and 33 for connecting carriers C each of which accommodates wafers W as substrates to be processed. An alignment chamber 34 for performing alignment of the wafer W is provided at a side wall of the atmospheric transfer chamber 31. An atmospheric transfer mechanism 36 for performing the loading/unloading of the wafer W with respect to the carrier C and the load-lock chambers 24a and 24b is provided in the atmospheric transfer chamber 31. The atmospheric transfer mechanism 36 has two articulated arms and is movable on a rail 38 along an arrangement direction of the carriers C. The atmospheric transfer mechanism 36 mounts the wafer W on a hand 37 at a leading end of each of the articulated arms to transfer the wafer W.

The Cu plating unit 102 includes a Cu plating apparatus and an annealing apparatus associated therewith, and the CMP processing unit 103 includes a CMP processing apparatus and an apparatus associated therewith.

The control unit 104 includes: a process controller 41 having a microprocessor (computer) for controlling the respective components of the dry film-forming unit 101, the Cu plating unit 102 and the CMP processing unit 103, and the first and the second carrier transfer device 105 and 106; a user interface 42; and a storage unit 43. The user interface 42 includes a keyboard through which an operator inputs a command to manage the Cu wiring manufacturing system 100, a display for visually displaying the operational states of the Cu wiring manufacturing system 100, and the like. The storage unit 43 stores therein control programs to be used in realizing various processes performed in the Cu wiring manufacturing system 100 under the control of the process controller 41, and programs, i.e., processing recipes, to be used in controlling the respective components of the processing apparatuses to carry out processes under processing conditions and various data. The user interface and the storage unit 43 are connected to the process controller 41.

The recipes are stored in a storage medium 43a in the storage unit 43. The storage medium 43a may be a hard disk, a portable medium such as a CD-ROM or a DVD, or a semiconductor memory such as a flash memory. Alternatively, the recipes may be suitably transmitted from other devices via, e.g., a dedicated transmission line.

If necessary, a certain recipe is read out from the storage medium 43a in the storage unit 43 under an instruction from the user interface 42 and is executed by the process controller 41. Accordingly, a desired process is performed in the Cu wiring manufacturing system 100 under the control of the process controller 41.

Next, the operation of the Cu wiring manufacturing system 100 will be described.

A carrier C, which accommodates etched and ashed wafers therein, is transferred to the dry film-forming unit 101 and set in a predetermined position. Then, a wafer W having a recess such as a trench or via is unloaded from the carrier C and loaded into the load-lock chamber 24a or 24b by the atmospheric transfer mechanism 36 after being aligned in the alignment chamber 34. After the pressure in the load-lock chamber is decreased to a vacuum level substantially equivalent to that in the second vacuum transfer chamber 21, the wafer W is unloaded from the load-lock chamber to be loaded into the degas chamber 13 through the second vacuum transfer chamber 21 by the second transfer mechanism 26. Thus, the wafer W is subjected to the degas process. Thereafter, the wafer W is unloaded from the degas chamber 13 to be loaded into any one of the $MnO_x$ film forming apparatuses 12a to 12d through the first vacuum transfer chamber 11 by the first transfer mechanism 16, and a $MnO_x$ film for forming the aforementioned self-formed barrier film is formed.

After the $MnO_x$ film is formed, the wafer W is transferred to the hydrogen radical processing apparatus 14 by the first transfer mechanism 16, and the hydrogen radical process is performed on the $MnO_x$ film. Then, the wafer W is unloaded from the hydrogen radical processing apparatus 14 to be loaded into the Ru film forming apparatus 22 through the second vacuum transfer chamber by the second transfer mechanism 26, and the aforementioned Ru film is formed as a layer to be wetted. After the Ru film is formed, the wafer W is unloaded from the Ru film forming apparatus 22 and transferred to the Cu-based film forming apparatus 23 by the second transfer mechanism 26, and the aforementioned Cu-based film (Cu or Cu alloy) is formed by iPVD to be filled in the recess such as the trench or via. Further, the delivery chamber 15 can be used as a buffer in which the wafer W is temporarily held.

After the Cu-based film is formed, the wafer W is transferred into the load-lock chamber 24a or 24b by the second transfer unit 26. After the pressure in the load-lock chamber is returned to the atmospheric pressure, the wafer W having the Cu-based film is unloaded by the atmospheric transfer unit 36 and returned to the carrier C. These processes are repeated for all of the wafers W in the carrier.

Next, the carrier C accommodating therein the wafers W subjected to the Cu-based film forming process is transferred to the Cu plating unit 102 by the first carrier transfer device 105. An additional Cu layer is formed on the wafer W having the Cu-based film formed thereon by Cu plating, and an annealing is performed.

Thereafter, the carrier C accommodating the wafer W subjected to the formation of the additional Cu layer is transferred to the CMP processing unit 103 by the second carrier transfer device 106, and a CMP process is performed.

The Cu wiring manufacturing system 100 can perform processes from the degas process to the CMP process on the wafer subjected to etching/ashing. In the dry film-forming unit 101, the degas process, the film-forming process of a $MnO_x$ film, the hydrogen radical process, the film-forming process of a Ru film, and the film-forming process of a Cu-based film are performed in a vacuum state on the wafer subjected to etching/ashing without exposure to an atmosphere. Accordingly, the oxidation of the films during the above processes can be prevented and a high-performance Cu wiring can be manufactured.

<iPVD Apparatus>

Figure 30:
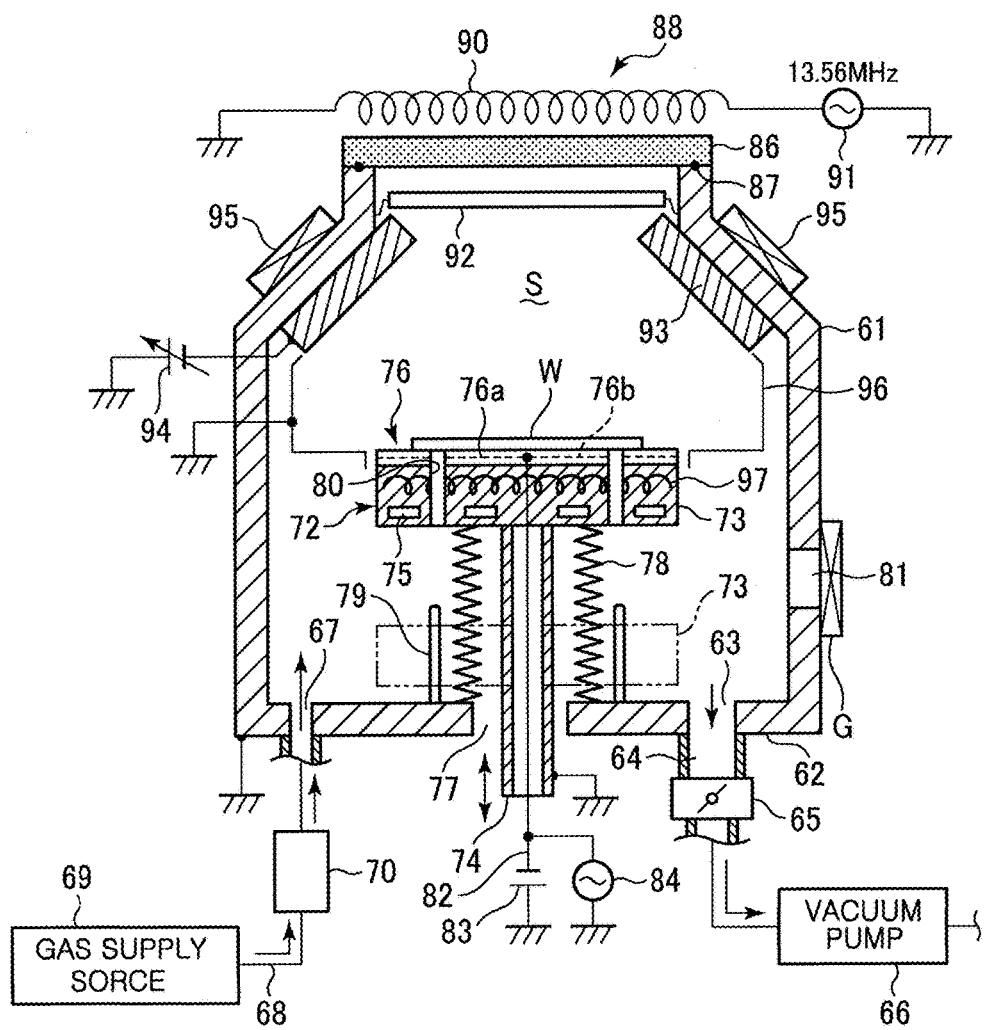
FIG. 30 is a cross-sectional view showing an example of an iPVD apparatus which can be properly used as a Cu-based film forming apparatus.

Hereinafter, an ICP (Inductively Coupled Plasma) plasma sputtering apparatus will be described as an example of an iPVD apparatus that can be preferably used for the Cu-based film forming apparatus 23 in the Cu wiring manufacturing system 100. FIG. 30 is a cross sectional view showing the ICP plasma sputtering apparatus.

As shown in FIG. 30, the PVD apparatus includes a processing chamber 61 that is grounded and made of a metal such as aluminum or the like. A gas exhaust port 63 and a gas inlet port 67 are provided at a bottom portion 62 of the processing chamber 61. A gas exhaust line 64 is connected to the gas exhaust port 63 and also connected to a throttle valve 65 and a vacuum pump 66 for pressure control. A gas supply line 68 is connected to the gas inlet port 67 and also connected to a gas supply source 69 for supplying a plasma excitation gas such as Ar gas or the like or another required gas such as $N_2$ gas or the like. A gas control unit 70 including a gas flow rate controller, a valve and the like is installed in the gas supply line 68.

Provided in the processing chamber 61 is a mounting mechanism 72 for mounting thereon a wafer W as a substrate to be processed. The mounting mechanism 72 including a disc-shaped mounting table 73 and a hollow cylindrical column 74. The mounting table 73 is made of a conductive material, e.g., an aluminum alloy or the like, and grounded via the column 74. The mounting table 73 has therein a cooling jacket 75 and thus is cooled by a coolant flowing through the cooling jacket 75. Further, a resistance heater 97 coated with an insulating material is buried above the cooling jacket 75 in the mounting table 73. The temperature of the wafer W can be controlled to a predetermined temperature by controlling the supply of power to the resistance heater 97 and the supply of the coolant to the cooling jacket 75.

An electrostatic chuck 76 including a dielectric member 76a and an electrode 76b embedded in the dielectric member 76a is provided on a top surface of the mounting table 73 to electrostatically attract and hold the wafer W. A lower portion of the column 74 extends downward through an insertion hole 77 formed in the center of the bottom portion 62 of the processing chamber 61. The column 74 is vertically movable by an elevation unit (not shown) to move the entire mounting mechanism 72 up and down.

An extensible/contractible metal bellows 78 is provided to surround the column 74. The metal bellows 78 has a top end attached to the bottom surface of the mounting table 73 and a bottom end attached to the top surface of the bottom portion 62 of the processing chamber 61. Accordingly, the mounting mechanism 72 can be vertically moved while maintaining the airtightness in the processing chamber 61.

A plurality of, e.g., three (only two are shown) support pins 79 is uprightly mounted on the bottom portion 62 toward the up side, and pin insertion holes 80 are formed in the mounting table 73 so as to correspond to the support pins 79. Therefore, when the mounting table 73 is lowered, the top end portions of the support pins 79 pass through the pin insertion holes 80 to receive the wafer W, so that the wafer W is transferred to/from a transfer arm (not shown) which comes from outside. A loading/unloading port 81 through which the transfer arm moves in and out is provided at a lower sidewall of the processing chamber 61, and an openable/closeable gate valve G is provided at the loading/unloading port 81.

A chuck power supply 83 is connected to the electrode 76b of the electrostatic chuck 76 through a power supply line 82. By applying a DC voltage from the chuck power supply 83 to the electrode 76b, the wafer W is attracted and held by an electrostatic force. Further, an RF bias power supply 84 is connected to the power supply line 82, so that an RF bias power is supplied to the electrode 76b of the electrostatic chuck 76 through the power supply line 82 to apply a bias power to the wafer W. The frequency of the RF power is preferably in a range from 400 kHz to 60 MHz, e.g., 13.56 MHz.

A transmitting plate 86 made of a dielectric material is hermetically provided at the ceiling portion of the processing chamber 61 through a seal member 87. A plasma generating source 88, for generating a plasma from a plasma excitation gas in a processing space S of the processing chamber 61, is provided above the transmitting plate 86.

The plasma generating source 88 has an induction coil 90 disposed to correspond to the transmitting plate 86. An RF power supply 91 for plasma generation, which has a high frequency of, e.g., 13.56 MHz, is connected to the induction coil 90. Accordingly, an RF power is introduced into the processing space S through the transmitting plate 86, and an induced electric field is formed in the processing space S.

A baffle plate 92 made of metal is provided directly under the transmitting plate 86 to diffuse the introduced RF power. An annular (truncated cone-shaped) target 93 having an inwardly upwardly inclined cross section and made of Cu or Cu alloy is disposed below the baffle plate 92 to surround an upper region of the processing space S. A variable-voltage DC power supply 94 is connected to the target 93 to apply a DC power for attracting Ar ions. Alternatively, an AC power supply may be used instead of the DC power supply.

A magnet 95 is provided at an outer peripheral side of the target 93. The target 93 is sputtered by Ar ions in the plasma, so that Cu or Cu alloy is released from the target 93 and they are mostly ionized while passing through the plasma.

A cylindrical protection cover member 96 made of, e.g., aluminum or copper, is provided below the target 93 to surround the processing space S. The protection cover member 96 is grounded, and an inner edge thereof is disposed to surround the outer peripheral side of the mounting table 73.

In the PVD apparatus configured as described above, the wafer W is loaded into the processing chamber 61 and is mounted on the mounting table 73. Then, the wafer W is electrostatically attracted and held on the electrostatic chuck 76. The following operations are performed under the control of the control unit 104. At this time, the temperature of the mounting table 73 is controlled by the cooling jacket 75 or the resistance heater 97 based on the temperature detected by a thermocouple (not shown).

First, the processing chamber 61 is set to a high vacuum state by operating the vacuum pump 66. Then, Ar gas is supplied into the processing chamber 61 at a predetermined flow rate by controlling the gas control unit 70 while the processing chamber 61 is maintained at a predetermined vacuum level by controlling the throttle valve 65. Next, a DC power is applied to the target 93 from the variable DC power supply 94, and an RF power (plasma generation power) is supplied to the induction coil 90 from the RF power supply 91 of the plasma generating source 88. Further, a predetermined RF bias power is supplied from the RF bias power supply 84 to the electrode 76b of the electrostatic chuck 76.

Hence, in the processing chamber 61, an Ar plasma is generated by the RF power supplied to the induction coil 90. Ar ions in the Ar plasma are attracted toward the target 93 by the DC voltage applied to the target 93 to collide with the target 93. The target 93 is sputtered to emit Cu particles. At this time, the amount of particles emitted from the target 93 is optimally controlled by the DC voltage applied to the target 93.

The Cu particles from the sputtered target 93 are mostly ionized while passing through the plasma. The ionized particles and electrically neutral atoms are mixed and are scattered downward. At this time, the particles can be ionized with high efficiency by increasing a density of the plasma by increasing the pressure in the processing chamber 61. The ionization rate at this time is controlled by the RF power supplied from the RF power supply 91.

When the ions are introduced into an ion sheath region formed above the wafer W with a thickness of about a few mm by the RF bias power applied from the RF bias power supply 84 to the electrode 76b of the electrostatic chuck 76, the ions are attracted with strong directivity toward the wafer W and deposited on the wafer W. As a consequence, the film-forming process of the Cu-based film is performed.

When the Cu film is formed, the wafer temperature is set to a high level (in a range from 65° C. to 400° C.), and the bias power applied from the RF bias power supply 84 to the electrode 76b of the electrostatic chuck 76 is controlled. With such control, the formation of the Cu film and the etching using Ar are controlled to facilitate the mobility of Cu. As a result, Cu can be filled with good fillability even in a trench or hole having a small opening.

<ALD Apparatus>

Figure 31:
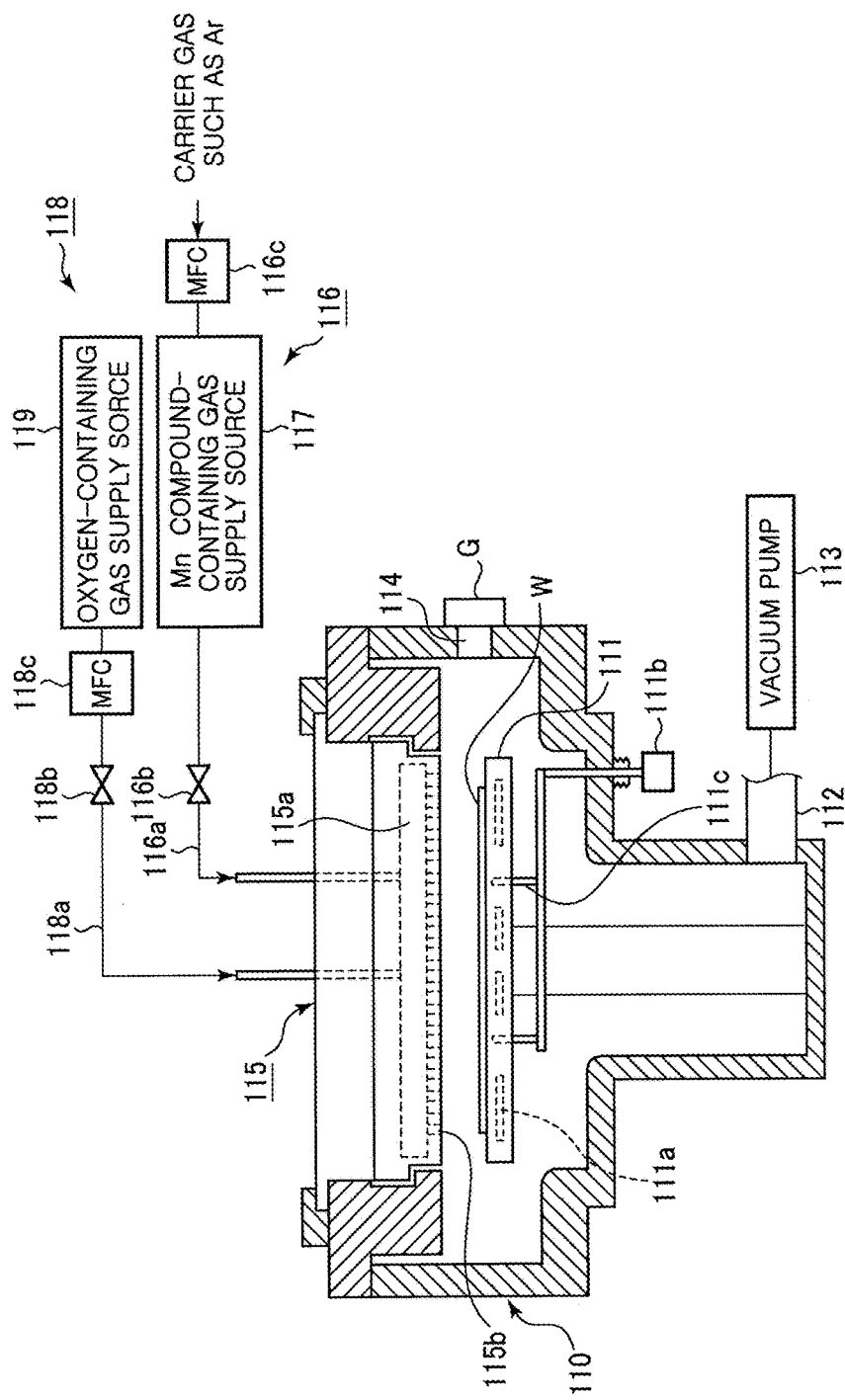
FIG. 31 is a cross-sectional view showing an example of an ALD apparatus which can be properly used as a $MnO_x$ film forming apparatus.

Hereinafter, an ALD apparatus that can be preferably used as the $MnO_x$ film forming apparatuses 12a to 12d used for the Cu wiring manufacturing system 100 will be described. FIG. 31 is a cross sectional view showing an example of the ALD apparatus for forming a $MnO_x$ film by ALD. The ALD apparatus can also be used, as a CVD apparatus, for the Ru film-forming device 22.

As shown in FIG. 31, the ALD apparatus includes a processing chamber 110. Provided in the processing chamber 110 is a mounting table 111 for horizontally mounting thereon the wafer W. The mounting table 111 has therein a heater 111a as a unit for controlling a wafer temperature. The mounting table 111 is provided with three elevating pins (only two are shown) 111c that can be vertically moved by an elevating mechanism 111b. The wafer W is transferred between the mounting table 111 and a wafer transfer unit (not shown) through the elevating pins 111c.

One end of the gas exhaust line 112 is connected to the bottom portion of the processing chamber 110 and the other end thereof is connected to a vacuum pump 113. A transfer port 114 that is opened and closed by the gate valve G is formed at a sidewall of the processing chamber 110.

A gas shower head 115 is provided at the ceiling portion of the processing chamber 110 to face the mounting table 111. The gas shower head 115 has a gas diffusion space 115a. A gas supplied into the gas diffusion space 115 is supplied into the processing chamber 110 through a plurality of gas injection openings 115b.

The gas shower head 115 is connected to a Mn compound-containing gas supply line system 116 for introducing a Mn compound-containing gas into the gas diffusion space 115a. The Mn compound-containing gas supply line system 116 includes a gas supply line 116a. A valve 116b, a Mn compound-containing gas supply source 117 and a mass flow controller 116c are provided at an upstream side of the gas supply line 116a. A Mn compound-containing gas is supplied from the Mn compound-containing gas supply source 117 by a bubbling method. Ar gas or the like may be used as a carrier gas for bubbling. The carrier gas also serves as a purge gas.

The gas shower head 115 is connected to an oxygen-containing gas supply line system 118 for introducing an oxygen-containing gas into the gas diffusion space 115a. The oxygen-containing gas supply line system 118 includes a gas supply line 118a. An oxygen-containing gas supply source 119 is connected to an upstream side of the gas supply line 118a via a valve 118b and a mass flow controller 118c. An oxygen-containing gas, e.g., $H_2O$ gas, $N_2O$ gas, $NO_2$ gas, NO gas, $O_2$ gas, $O_3$ gas or the like, is supplied from the oxygen-containing gas supply source 119. The oxygen-containing gas supply line system 118 can supply Ar gas or the like as a purge gas.

In the present embodiment, the gas diffusion space 115a of the gas shower head 115 is used for both of the Mn compound-containing gas and the oxygen-containing gas and they are alternately supplied into the processing chamber 110 through the gas injection openings 115b. However, a gas diffusion space for a Mn compound-containing gas and a gas diffusion space for an oxygen-containing gas may be separately provided in the gas shower head 115 so that they are separately supplied into the processing chamber 110.

In the ALD apparatus configured as described above, the wafer W is loaded into the processing chamber 110 through the transfer port 114 and mounted on the mounting table 111 controlled to a predetermined temperature. Then, a pressure in the processing chamber 110 is controlled to a predetermined level, and a $MnO_x$ film having a predetermined film thickness is formed by an ALD method by repeating multiple times the supply of the Mn compound-containing gas from the Mn compound-containing gas supply line system 116 and the supply of the oxygen-containing gas from the oxygen-containing gas supply line system 118 with a purge process for purging the inside of the processing chamber 110 interposed between the supply of the Mn compound-containing gas and the supply of the oxygen-containing gas. Upon completion of the film formation, the processed wafer W is unloaded through the transfer port 114.

<Hydrogen Radical Processing Apparatus>

Hereinafter, an example of a hydrogen radical processing apparatus used for the Cu wiring manufacturing system 100 will be described.

Figure 32:
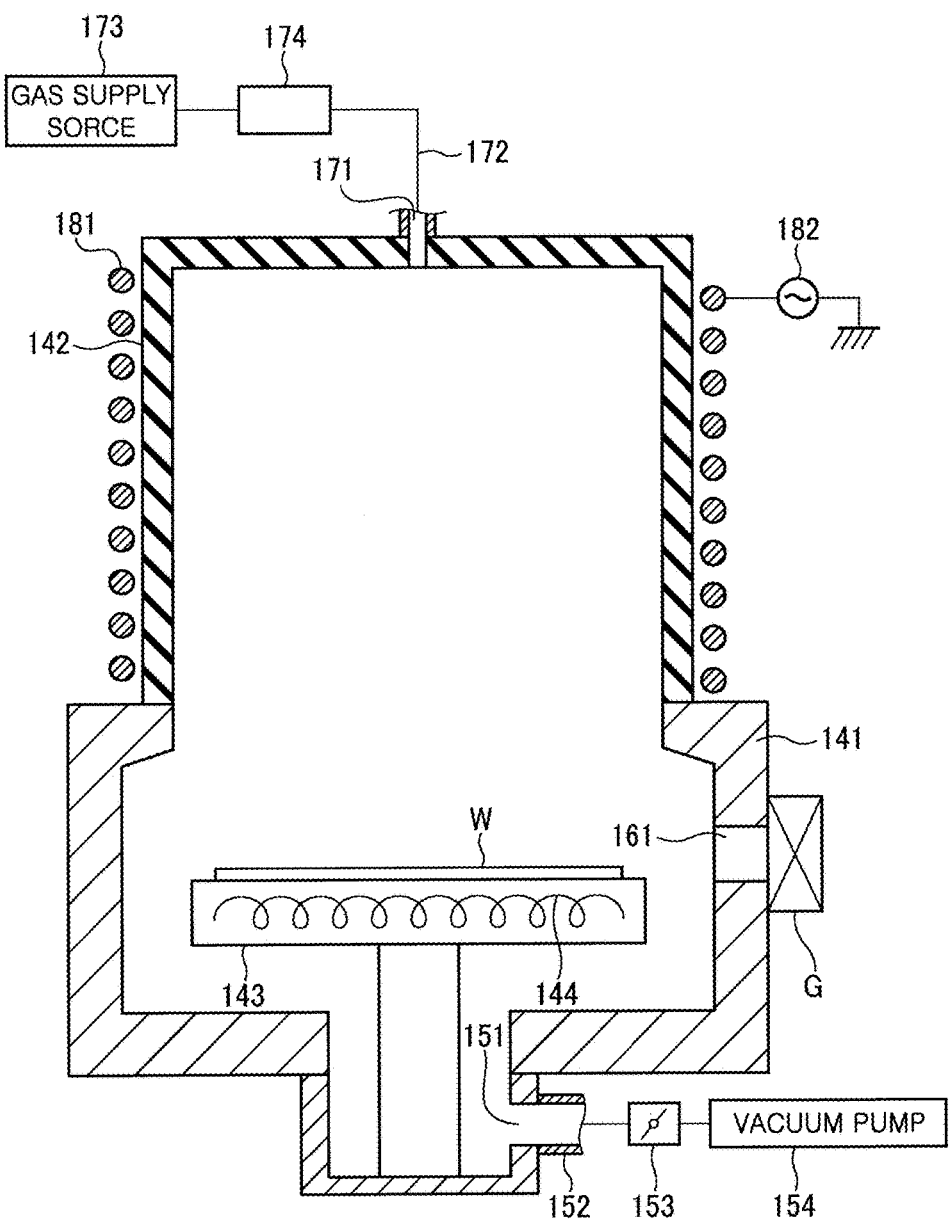
FIG. 32 is a cross-sectional view showing an example of a hydrogen radical processing apparatus.

FIG. 32 is a cross sectional view showing an example of the hydrogen radical processing apparatus and explains a process of generating hydrogen radicals in the processing chamber by a remote plasma process.

As shown in FIG. 32, the hydrogen radical processing apparatus includes a cylindrical processing chamber 141 made of, e.g., aluminum or the like, and configured to perform a hydrogen radical process, and a cylindrical bell jar 142 made of a dielectric material and provided on the processing chamber 141. The bell jar 142 has a diameter smaller than that of the processing chamber 141. A wall portion of the processing chamber 141 and a wall portion of the bell jar 142 are hermetically formed. The inside of the processing chamber 141 and the inside of the bell jar 142 communicate with each other.

The processing chamber 141 has therein a mounting table 143 made of ceramic, e.g., AlN or the like, for mounting thereon a wafer W. The mounting table 143 has therein a heater 144. The heater 144 generates heat by a power supplied from a heater power supply (not shown). The mounting table 143 is provided with three wafer support pins (not shown) for transferring a wafer. The three wafer support pins can protrude beyond and retreat below the surface of the mounting table 143.

A gas exhaust port 151 is provided at the bottom portion of the processing chamber 141. A gas exhaust line 152 is connected to the gas exhaust port 151. The gas exhaust line 152 is connected to a throttle valve 153 and a vacuum pump 154 for pressure control, so that the processing chamber 141 and the bell jar 142 can be exhausted to vacuum. A wafer loading/unloading port 161 is formed at a sidewall of the processing chamber 141 and can be opened/closed by a gate valve G. The wafer W is loaded and unloaded in a state where the gate valve G is opened.

A gas inlet port 171 is formed in a center of a ceiling wall of the bell jar 142. A gas supply line 172 is connected to the gas inlet port 171 and also connected to a gas supply source 173 for supplying an inert gas or a hydrogen gas used for the hydrogen radical process. A gas control unit 174 including a gas flow rate controller, a valve and the like is installed in the gas supply line 172.

A coil 181 is wound as an antenna around the bell jar 142. An RF power supply 182 is connected to the coil 181. An inductively coupled plasma is generated in the bell jar 142 by supplying an RF power to the coil 181 while supplying hydrogen gas and an inert gas into the bell jar 142. Accordingly, a hydrogen plasma process is performed on a $MnO_x$ film of the wafer W in the processing chamber 141.

In the hydrogen radical processing apparatus configured as described above, the gate valve G is opened and the wafer W is mounted on the mounting table 143. Then, the gate valve G is closed, and the processing chamber 141 and the bell jar 142 are evacuated by the vacuum pump 154 so that the pressures in the processing chamber 141 and the bell jar 142 are controlled to a predetermined level. In a state where the wafer W mounted on the mounting table 143 is heated to a predetermined temperature by the heater 144, an inert gas and hydrogen gas used for the hydrogen radical process are introduced into the processing chamber 141 from the gas supply source 173 through the gas supply line 172 and the gas supply port 171 and, also, an RF power is supplied from the RF power supply 182 to the coil 181. Accordingly, the inert gas and the hydrogen gas are excited and an inductively coupled plasma is generated in the bell jar 142. The inductively coupled plasma thus generated is introduced into the processing chamber 141. The hydrogen plasma process is performed on the $MnO_x$ film of the wafer W by hydrogen radicals in the plasma.

OTHER APPLICATIONS

While the embodiment of the present invention has been described, the present invention may be variously modified without being limited to the above embodiment. For example, the dry film-forming unit is not limited to the type shown in FIG. 28 in which the processes from the degas process to the film-forming process of a Cu-based film are performed in the common processing unit, and may be of a type including a processing unit of performing processes from the degas process to the film-forming process of a $MnO_x$ film and a processing unit of performing processes from the hydrogen radical process to the film-forming process of a Ru film and the film-forming process of a Cu-based film. This is because even when the wafer is exposed to an atmosphere after the formation of a $MnO_x$ film, the effect of the exposure to an atmosphere can be reset by the hydrogen radical process.

In the above embodiment, the example in which the method of the disclosure is applied to the wafer having a trench and a via is described. However, the disclosure may be applied to the case in which a wafer has either one of a trench or a via. Further, the method of the disclosure may be applied to the manufacture of Cu wiring in devices of various structures such as a 3D mounting structure or the like in addition to a single damascene structure and a dual damascene structure.

Further, although a semiconductor wafer is described as an example of a substrate to be processed in the above embodiment, the semiconductor wafer may include a compound semiconductor such as GaAs, SiC, GaN or the like as well as a silicon. Further, the present invention may be applied to a ceramic substrate, a glass substrate for use in a FPD (flat panel display) such as a liquid crystal display or the like, and the like without being limited to a semiconductor wafer.

While the invention has been shown and described with respect to the embodiments, it will be understood by those skilled in the art that various changes and modifications may be made without departing from the scope of the invention as defined in the following claims.

What is claimed is:

1. A Cu wiring manufacturing method for manufacturing a Cu wiring that fills a recess formed in a predetermined pattern on a surface of an interlayer insulating film of a substrate, the method comprising:
    forming a $MnO_x$ film which becomes a self-formed barrier film by reaction with the interlayer insulating film at least on a surface of the recess by ALD;
    performing a hydrogen radical process on a surface of the $MnO_x$ film to reduce the surface of the $MnO_x$ film;
    forming a Ru film by CVD on the surface of the $MnO_x$ film which has been reduced by the hydrogen radical process; and
    forming a Cu-based film on the Ru film by PVD to fill the Cu-based film in the recess;
    wherein when the Ru film is formed, a film-formation condition of the $MnO_x$ film and a condition of the hydrogen radical process are set such that nucleus formation is facilitated,
    wherein the $MnO_x$ film is formed by alternately supplying a Mn compound-containing gas and an oxygen-containing gas into a processing chamber accommodating the substrate with a purge process for purging an inside of the processing chamber interposed between the supply of the Mn compound-containing gas and the supply of the oxygen-containing gas, and
    wherein a film thickness of the $MnO_x$ film is in the range of 1 nm to 4.5 nm and a temperature of the substrate is set to be lower than a thermal decomposition temperature of a Mn compound in the Mn compound-containing gas.

2. The Cu wiring manufacturing method of claim 1, wherein a number of cycles in the alternately supplying the Mn compound-containing gas and the oxygen-containing gas is between 17 to 60.

3. The Cu wiring manufacturing method of claim 2, wherein the number of the cycles is in the range of 19 to 31.

4. The Cu wiring manufacturing method of claim 1, wherein the film thickness of the $MnO_x$ film is in the range of 1 nm to 2.5 nm.

5. The Cu wiring manufacturing method of claim 4, wherein a part of the $MnO_x$ film becomes Mn silicate by heat generated when the $MnO_x$ film is formed or by heat generated during a subsequent process, and a ratio of the Mn silicate to a sum of the Mn silicate and a remaining $MnO_x$ film is 30% or more.

6. The Cu wiring manufacturing method of claim 1, wherein the Mn compound is selected among a cyclopentadienyl-based manganese compound, an amidinate-based manganese compound and an amide amino alkane-based manganese compound, and
    wherein when the $MnO_x$ film is formed, the temperature of the substrate is in the range of 130° C. to 180° C.

7. The Cu wiring manufacturing method of claim 1, wherein the hydrogen radical process is performed for 100 sec or more while a temperature of the substrate is in the range of 200° C. to 400° C.

8. The Cu wiring manufacturing method of claim 7, wherein in the hydrogen radical process, the temperature of the substrate is in the range of 300° C. to 400° C.

9. The Cu wiring manufacturing method of claim 7, wherein the hydrogen radical process is performed by supplying a plasma of a hydrogen-containing gas to the substrate.

10. The Cu wiring manufacturing method of claim 1, wherein the Ru film is formed with a film thickness in the range of 1.5 nm to 4.5 nm by using ruthenium carbonyl as a film-forming material and a temperature of the substrate is in the range of 170° C. to 230° C.

11. The Cu wiring manufacturing method of claim 10, wherein when the Ru film is formed, the temperature of the substrate is in the range of 190° C. to 200° C.

12. The Cu wiring manufacturing method of claim 11, wherein the film thickness of the Ru film is in a range of 2.5 nm to 3.8 nm.

13. The Cu wiring manufacturing method of claim 1, wherein the Cu-based film is formed by ionization PVD while the temperature of the substrate is in the range of 230° C. to 350° C.

14. A computer-executable storage medium storing a program for controlling a Cu wiring manufacturing system, wherein the program, when executed, controls the Cu wiring manufacturing system on a computer to perform the Cu wiring manufacturing method described in claim 1.

15. A Cu wiring manufacturing method for manufacturing a Cu wiring that fills a recess formed in a predetermined pattern on a surface of an interlayer insulating film of a substrate, the method comprising:
forming a $MnO_x$ film, wherein the $MnO_x$ film becomes a self-formed barrier film by reaction with the interlayer insulating film at least on a surface of the recess by ALD;
performing a hydrogen radical process on a surface of the $MnO_x$ film to reduce the surface of the $MnO_x$ film;
forming a Ru film by CVD on the surface of the $MnO_x$ film which has been reduced by the hydrogen radical process; and
forming a Cu-based film on the Ru film by PVD to fill the Cu-based film in the recess;
wherein the $MnO_x$ film is formed by alternately supplying a Mn compound-containing gas and an oxygen-containing gas into a processing chamber accommodating the substrate with a purge process for purging an inside of the processing chamber interposed between the supply of the Mn compound-containing gas and the supply of the oxygen-containing gas,
wherein a film thickness of the $MnO_x$ film is in the range of 1 nm to 4.5 nm and a temperature of the substrate is lower than a thermal decomposition temperature of a Mn compound in the Mn compound-containing gas, and
wherein the hydrogen radical process is performed for 100 sec or more while the temperature of the substrate is in the range of 200° C. to 400° C.

16. The Cu wiring manufacturing method of claim 15, wherein a number of cycles in the alternately supplying the manganese compound-containing gas and the oxygen-containing gas is in the range of 17 to 60.

17. The Cu wiring manufacturing method of claim 16, wherein the number of the cycles is in the range of 19 to 31.

18. The Cu wiring manufacturing method of claim 15, wherein the thickness of the $MnO_x$ film is in the range of 1 nm to 2.5 nm.

19. The Cu wiring manufacturing method of claim 18, wherein a part of the $MnO_x$ film becomes Mn silicate by heat generated when the $MnO_x$ film is formed or by heat generated during a subsequent process, and a ratio of the Mn silicate to a sum of the Mn silicate and a remaining $MnO_x$ film is 30% or more.

20. The Cu wiring manufacturing method of claim 15, wherein the Mn compound is selected among a cyclopentadienyl-based manganese compound, an amidinate-based manganese compound, an amide amino alkane-based manganese compound, and
wherein when the $MnO_x$ film is formed, the temperature of the substrate is in the range of 130° C. to 180° C.

21. The Cu wiring manufacturing method of claim 15, wherein in the hydrogen radial process, the temperature of the substrate is in the range of 300° C. to 400° C.

22. The Cu wiring manufacturing method of claim 15, wherein the hydrogen radical process is performed by supplying radicals in a plasma of a hydrogen-containing gas to the substrate.

* * * * *